(12) United States Patent
Kang et al.

(10) Patent No.: US 11,650,237 B2
(45) Date of Patent: May 16, 2023

(54) METHOD OF MANUFACTURING AN INTEGRATED CIRCUIT INVOLVING PERFORMING AN ELECTROSTATIC DISCHARGE TEST AND ELECTROSTATIC DISCHARGE TEST SYSTEM PERFORMING THE SAME

(71) Applicant: Samsung Electronics Co., Ltd., Suwon-si (KR)

(72) Inventors: Bonggyu Kang, Yongin-si (KR); Youngsoo Jang, Seoul (KR); Heesu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 151 days.

(21) Appl. No.: 17/342,241

(22) Filed: Jun. 8, 2021

(65) Prior Publication Data
US 2022/0091171 A1    Mar. 24, 2022

(30) Foreign Application Priority Data

Sep. 22, 2020    (KR) .................... 10-2020-0122530

(51) Int. Cl.
*G01R 31/00* (2006.01)
*G01R 3/00* (2006.01)
(Continued)

(52) U.S. Cl.
CPC ............. *G01R 31/002* (2013.01); *G01R 3/00* (2013.01); *G01R 23/163* (2013.01); *G01R 31/2841* (2013.01)

(58) Field of Classification Search
CPC .... G01R 31/002; G01R 31/00; G01R 23/163; G01R 31/28; G01R 31/2806; G01R 31/12;
(Continued)

(56) References Cited

U.S. PATENT DOCUMENTS 8,410,791 B2    4/2013    Tsukagoshi et al.
8,981,790 B2    3/2015    Nakamura et al.
(Continued)

OTHER PUBLICATIONS

Extended European Search Report dated Dec. 23, 2021 from the European Patent Office for corresponding European Patent Application No. 21183763.8.

*Primary Examiner* — Son T Le
(74) *Attorney, Agent, or Firm* — Muir Patent Law, PLLC

(57) ABSTRACT

In a method of manufacturing an integrated circuit involving performing an electrostatic discharge (ESD) test, a weak frequency band is detected by sequentially radiating a plurality of first electromagnetic waves on a first test board including the integrated circuit. First peak-to-peak voltage signals are detected by sequentially radiating the plurality of first electromagnetic waves on a second test board including an electromagnetic wave receiving module. A frequency spectrum is detected by radiating a second electromagnetic wave on a housing including a third test board including the electromagnetic wave receiving module. A second peak-to-peak voltage signal is generated based on the weak frequency band, the first peak-to-peak voltage signals and the frequency spectrum. An ESD characteristic associated with an electronic system including the integrated circuit is predicted based on the second peak-to-peak voltage signal.

20 Claims, 22 Drawing Sheets

(51) Int. Cl.
*G01R 23/163* (2006.01)
*G01R 31/28* (2006.01)

(58) Field of Classification Search
CPC ............ G01R 31/2841; G01R 31/2831; G01R 31/2868; G01R 31/2851; G01R 29/0892; G01R 23/16; G01R 29/08; G01R 29/0814; G01R 29/0871; G01R 29/0878; G01R 5/28; G01R 29/12; G01R 15/165; H01L 22/14; H01L 22/20; H01L 23/60
See application file for complete search history.

(56) References Cited

U.S. PATENT DOCUMENTS

| | | | |
|---|---|---|---|
| 9,627,753 B2 | 4/2017 | Caimi et al. | |
| 9,671,448 B2 | 6/2017 | Nelsen et al. | |
| 10,416,215 B2 | 9/2019 | Beaty et al. | |
| 10,551,422 B2 | 2/2020 | Hiraga | |
| 2014/0179239 A1* | 6/2014 | Nickel | G01R 31/2822 455/67.14 |
| 2014/0184253 A1 | 7/2014 | Nelsen et al. | |
| 2014/0191778 A1 | 7/2014 | DeForge et al. | |
| 2015/0346254 A1* | 12/2015 | Nara | G01R 29/0835 324/613 |

\* cited by examiner

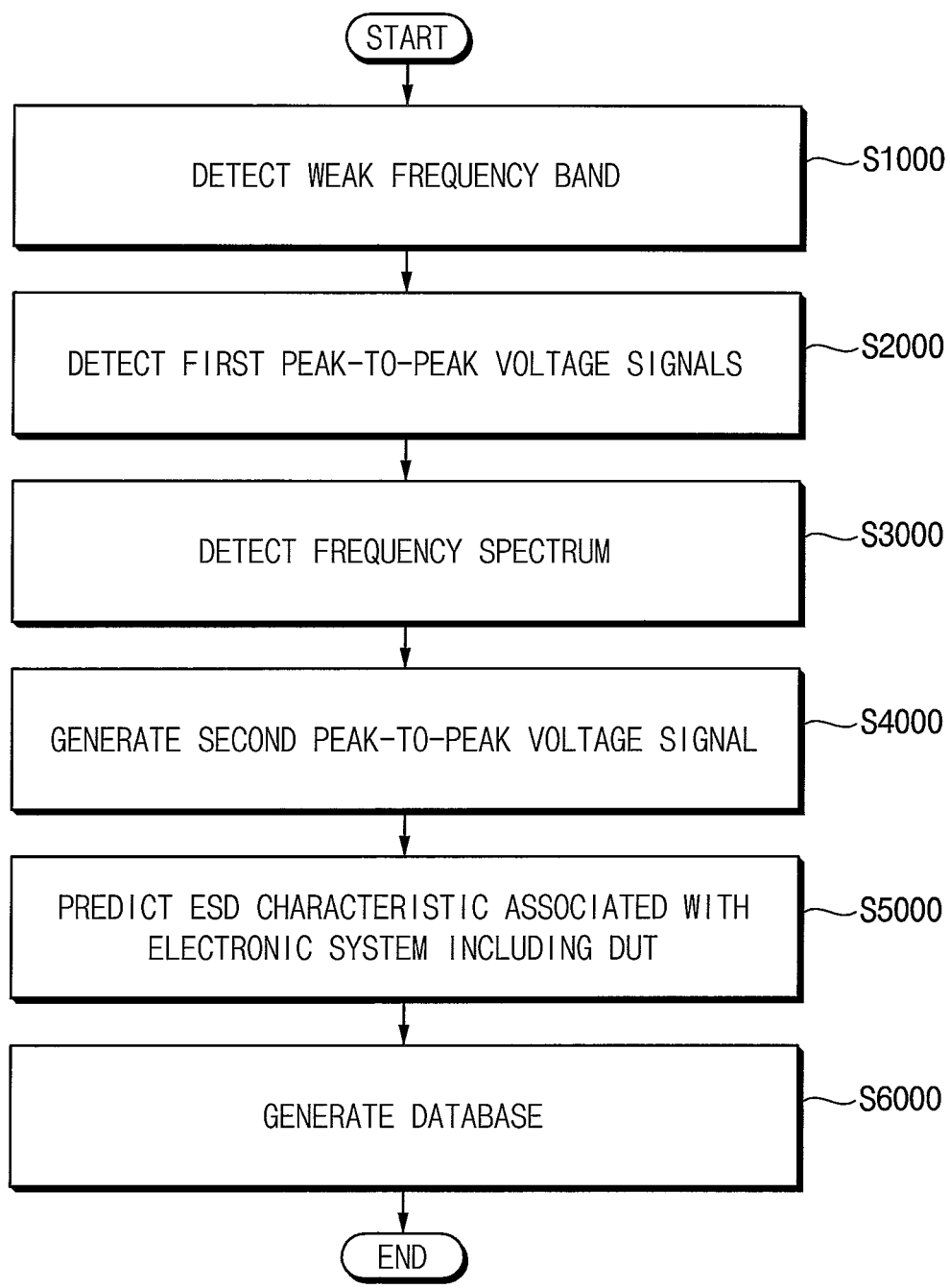

FIG. 3A
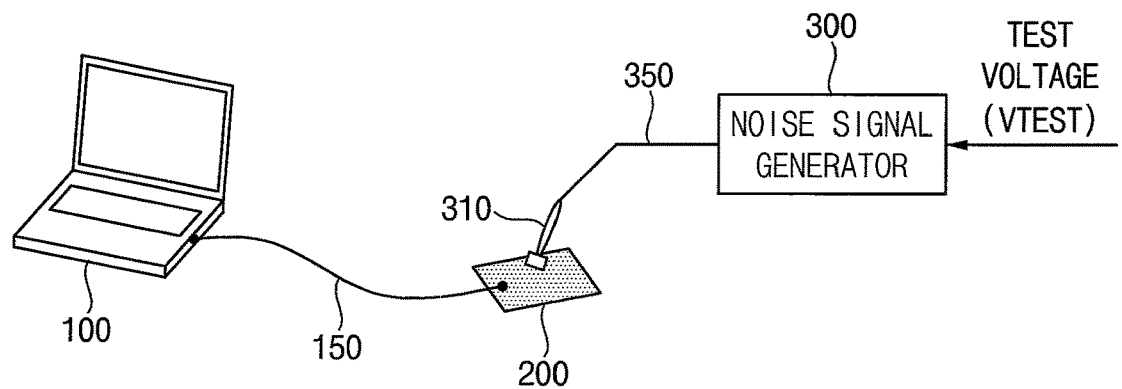
FIG. 3B
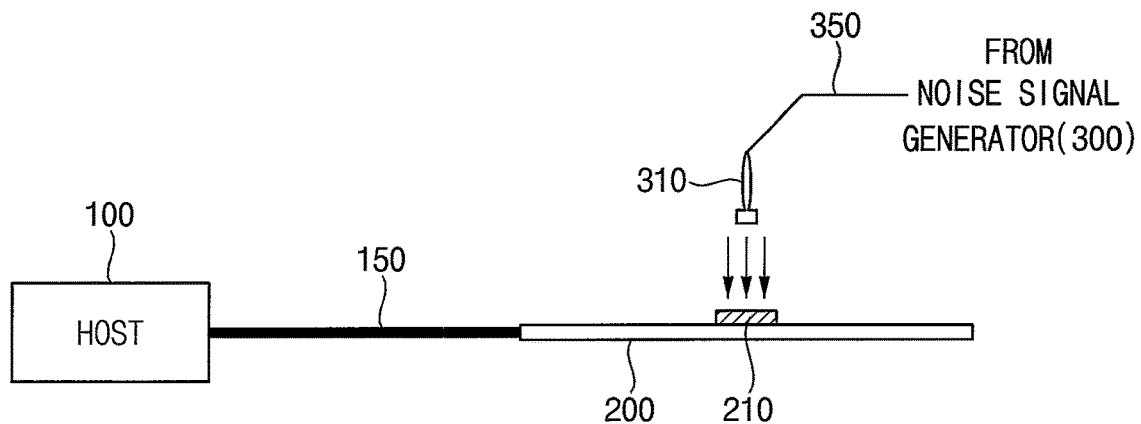
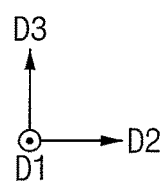

FIG. 6

| FREQUENCY(GHz) | SOFT FAIL TEST RESULT | |
|---|---|---|
| 1.96 | PASS | |
| 2.00 | FAIL | ⎫ |
| 2.04 | FAIL | ⎪ |
| 2.08 | FAIL | ⎪ |
| 2.12 | FAIL | ⎪ |
| 2.16 | FAIL | ⎬ WEAK BAND |
| 2.20 | FAIL | ⎪ |
| 2.24 | FAIL | ⎪ |
| 2.28 | FAIL | ⎪ |
| 2.32 | FAIL | ⎪ |
| 2.36 | FAIL | ⎪ |
| 2.40 | FAIL | ⎭ |
| 2.44 | PASS | |
| 2.48 | PASS | |

FIG. 7A
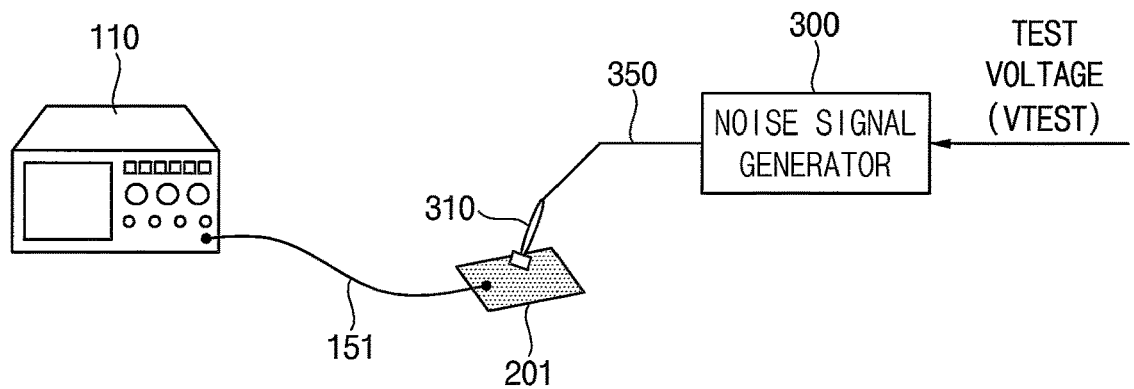
FIG. 7B
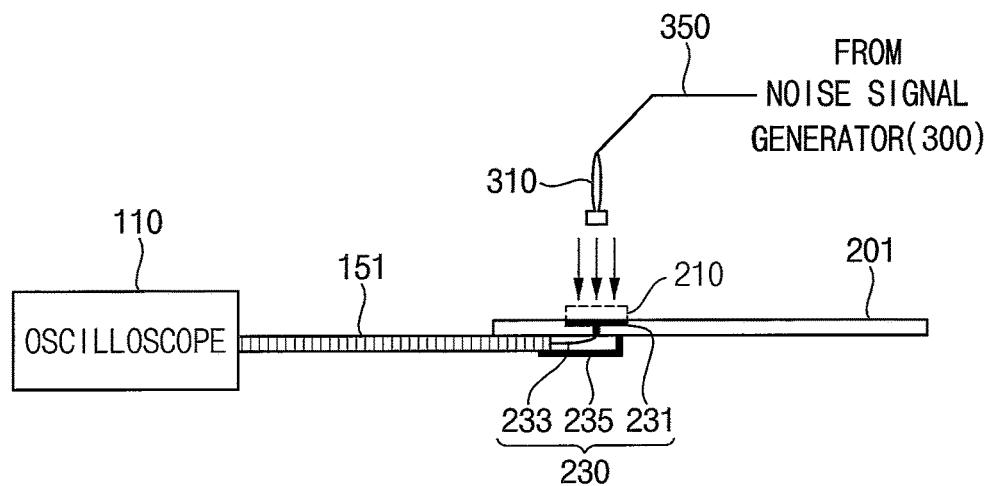
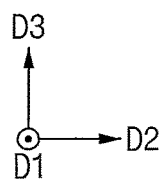

| FREQUENCY(GHz) | 1.96 | 2.00 | 2.04 | 2.08 | 2.12 | 2.16 | 2.20 |
|---|---|---|---|---|---|---|---|
| VPP1(V) | 5.5 | 4.4 | 4.6 | 4.3 | 4.2 | 4.1 | 3.8 |
| FREQUENCY(GHz) | 2.24 | 2.28 | 2.32 | 2.36 | 2.40 | 2.44 | 2.48 |
| VPP1(V) | 3.5 | 3.9 | 5.4 | 6.5 | 8.5 | 9 | 9.5 |

| FREQUENCY(GHz) | 1.96 | 2.00 | 2.04 | 2.08 | 2.12 | 2.16 | 2.20 |
|---|---|---|---|---|---|---|---|
| VOLTAGE PEAKTOPEAK (VPP1) | – | 4.4 | 4.6 | 4.3 | 4.2 | 4.1 | 3.8 |
| COMPENSATION FACTOR (VPP-1) | – | 0.23 | 0.22 | 0.23 | 0.24 | 0.24 | 0.26 |
| FREQUENCY(GHz) | 2.24 | 2.28 | 2.32 | 2.36 | 2.40 | 2.44 | 2.48 |
| VOLTAGE PEAKTOPEAK (VPP1) | 3.5 | 3.9 | 5.4 | 6.5 | 8.5 | – | – |
| COMPENSATION FACTOR (VPP-1) | 0.29 | 0.26 | 0.19 | 0.15 | 0.12 | – | – |

| | SYSTEM1 | |
|---|---|---|
| VREF = VREF1, VTEST = VTEST1 ||| 
| TP | BW | Vpp |
| IC1 { PW1,PH1 | BW1 | Vpp1 |

| SYSTEM1 | | |
|---|---|---|
| VREF = VREF1, VTEST = VTEST1 | | |
| TP | BW | Vpp |
| PW1,PH1 | BW1 | Vpp1 |
| PW2,PH2 | BW1 | Vpp2 |
| PW3,PH3 | BW1 | Vpp3 |

IC1 { (rows 1-3 of data)

FIG. 24B

| | SYSTEM1 | | | | SYSTEM3 | | |
|---|---|---|---|---|---|---|---|
| | VTEST = VTEST1 | | | | VTEST = VTEST1 | | |
| | TP | BW | Vpp | | TP | BW | Vpp |
| IC1 { | PW1,PH1 | BW1 | Vpp1 | IC2 { | PW1,PH1 | BW2 | Vpp7 |
| | PW2,PH2 | BW1 | Vpp2 | | PW2,PH2 | BW2 | Vpp8 |
| | PW3,PH3 | BW1 | Vpp3 | | PW3,PH3 | BW2 | Vpp9 |
| | SYSTEM2 | | | | SYSTEM4 | | |
| | VTEST = VTEST1 | | | | VTEST = VTEST1 | | |
| | TP | BW | Vpp | | TP | BW | Vpp |
| IC1 { | PW1,PH1 | BW1 | Vpp4 | IC2 { | PW1,PH1 | BW2 | Vpp10 |
| | PW2,PH2 | BW1 | Vpp5 | | PW2,PH2 | BW2 | Vpp11 |
| | PW3,PH3 | BW1 | Vpp6 | | PW3,PH3 | BW2 | Vpp12 |

METHOD OF MANUFACTURING AN INTEGRATED CIRCUIT INVOLVING PERFORMING AN ELECTROSTATIC DISCHARGE TEST AND ELECTROSTATIC DISCHARGE TEST SYSTEM PERFORMING THE SAME

CROSS-REFERENCE TO RELATED APPLICATION

This U.S. non-provisional application claims priority under 35 USC § 119 to Korean Patent Application No. 10-2020-0122530, filed on Sep. 22, 2020, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a method of performing electrostatic discharge test and an electrostatic discharge test system performing the method.

2. Discussion of the Related Art

A semiconductor integrated circuit is shipped as a product after a wafer level process, a package level process and a post package level process are performed. The semiconductor integrated circuit is delivered to customers and mounted inside electronic systems such as semiconductor systems to perform their own functions. The semiconductor integrated circuit undergoes various performance tests before being shipped as a product. An electrostatic discharge (ESD) test is one of the performance tests, and tests an electro-magnetic susceptibility of the semiconductor integrated circuit manufactured in a semiconductor package. As such, the ESD test is a part of the manufacturing process of the semiconductor integrated circuit. Although the semiconductor integrated circuit may be determined to be good as a result of performing the ESD test, when the semiconductor integrated circuit is actually mounted and operated in an electronic system, a defect may occur inside the electronic system. This is because electromagnetic characteristics applied to the semiconductor integrated circuit may vary according to a layout or housing of a circuit board constituting the electronic system. The variation of the electromagnetic characteristics may affect the semiconductor integrated circuit mounted inside the electronic system. As a result, when mounted inside an electronic system, the semiconductor integrated circuit may now be susceptible to an electrostatic discharge.

SUMMARY

Some example embodiments may provide a method of performing electrostatic discharge test and an electrostatic discharge test system, capable of predicting an electrostatic discharge characteristic associated with an electronic system including a device under test.

According to example embodiments, in a method of manufacturing an integrated circuit involving performing an electrostatic discharge (ESD) test, a weak frequency band is detected by sequentially radiating a plurality of first electromagnetic waves on a first test board including the integrated circuit. First peak-to-peak voltage signals are detected by sequentially radiating the plurality of first electromagnetic waves on a second test board including an electromagnetic wave receiving module. A frequency spectrum is detected by radiating a second electromagnetic wave on a housing including a third test board including the electromagnetic wave receiving module. A second peak-to-peak voltage signal is generated based on the weak frequency band, the first peak-to-peak voltage signals and the frequency spectrum. An ESD characteristic associated with an electronic system including the integrated circuit is predicted based on the second peak-to-peak voltage signal.

According to example embodiments, an ESD test system includes a first tester, a second tester and an automatic test equipment. The first tester sequentially radiates a plurality of first electromagnetic waves on a first test board including a device under test (DUT), and sequentially radiates the plurality of first electromagnetic waves on a second test board including an electromagnetic wave receiving module. The second tester radiates a second electromagnetic wave on a housing including a third test board including the electromagnetic wave receiving module. The automatic test equipment detects a weak frequency band associated with the DUT based on sequentially radiating the plurality of first electromagnetic waves on the first test board, detects a first peak-to-peak voltage signal associated with the DUT based on sequentially radiating the plurality of first electromagnetic waves on the second test board, configured to detect a frequency spectrum based on radiating the second electromagnetic wave on the housing, generates a second peak-to-peak voltage signal based on the weak frequency band, the first peak-to-peak voltage signals and the frequency spectrum, and predicts an ESD characteristic associated with an electronic system including the DUT based on the second peak-to-peak voltage signal.

In a method of performing electrostatic discharge test and an electrostatic discharge test of the present disclosure, after completing a package level process, a plurality of tests are performed on a DUT including an integrated circuit package before shipping the integrated circuit package as a finished product. Further, based on the results of performing the plurality of tests, an ESD characteristic associated with an electronic system including the DUT may be predicted in advance.

BRIEF DESCRIPTION OF THE DRAWINGS

Example embodiments of the present disclosure will be more clearly understood from the following detailed description taken in conjunction with the accompanying drawings.

FIG. 2 is a flowchart illustrating a method of performing electrostatic discharge test according to example embodiments.

FIGS. 3A, 3B and 3C are diagrams illustrating an example of devices for detecting a weak frequency band in FIG. 2.

FIG. 6 is a diagram illustrating a process of detecting a weak frequency band in FIG. 2.

FIGS. 7A and 7B are diagrams illustrating an example of devices for detecting first peak-to-peak voltage signals in FIG. 2.

FIG. 24B is a diagram illustrating an example of a database for a DUT in FIG. 2.

DETAILED DESCRIPTION OF THE EMBODIMENTS

Figure 1:
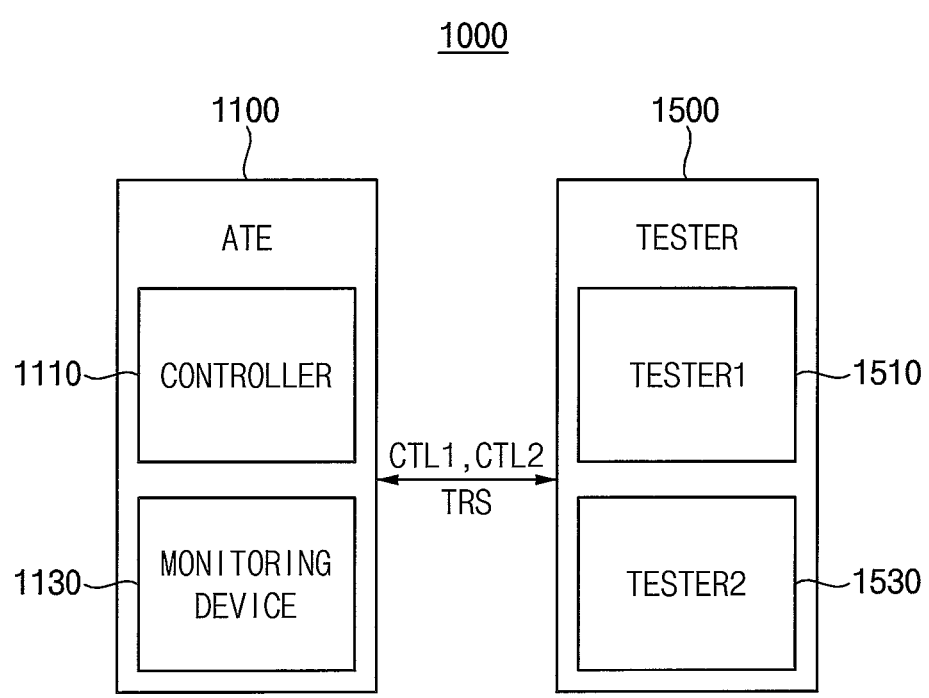
FIG. 1 is a block diagram illustrating an electrostatic discharge test system according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating an electrostatic discharge test system according to example embodiments.

Referring to FIG. 1, an electrostatic discharge (ESD) test system 1000 includes an Automatic Test Equipment (ATE) 1100 and a tester 1500. The ATE 1100 includes a controller 1110 and a monitoring device 1130, and the tester 1500 includes a first tester (TESTER1) 1510 and a second tester (TESTER2) 1530.

The ATE 1100 controls a plurality of tests associated with a device under test (DUT). In some embodiments, the DUT may be a semiconductor integrated circuit manufactured as a semiconductor package, that is, an integrated circuit package.

In some embodiments, the plurality of tests may include a series of test processes, and each of the plurality of tests may be performed based on the International Electrotechnical Commission (IEC) 61000-4-2 standard In some embodiments, the plurality of tests may include a first test, a second test and a third test. Each of the first test and the second test may be performed using a test board, and the third test may be performed using a housing. In the first test, the test board may include the DUT. In the second test, the DUT may include an electromagnetic wave receiving module. In the third test, the housing may include a test board. In the third test, the test board included in the housing may include the electromagnetic wave receiving module.

The ATE 1100 generates control signals CTL1 and CTL2 to control the plurality of tests and provides the control signals CTL1 and CTL2 to the tester 1500. In some embodiments, the control signals CTL1 and CTL2 may be generated by the controller 1110.

The tester 1500 performs the plurality of tests on the DUT under a control of the ATE 1100 and provides various result signals TRS generated by performing the plurality of tests to the ATE 1100. The result signals TRS may be referred to as 'test result data' or 'test result signals'. In some embodiments, the plurality of tests may be performed by either the first tester 1510 or the second tester 1530. More specifically, the first tester 1510 may perform the first test and the second test, and the second tester 1530 may perform the third test. The result signals TRS may be provided to the monitoring device 1130. The monitoring device 1130 may generate test result information based on the result signals TRS. The test result information may be generated for each of the first test, the second test and the third test.

The ATE 1100 may predict an ESD characteristic associated with an electronic system including the DUT based on the test result information. That is, the ESD test system 1000 performs the plurality of tests after completing a package level process and before shipping an integrated circuit package as a finished product, and may predict the ESD characteristic of the electronic system in advance of completing the manufacturing of the electronic system. The ESD characteristic of the electronic system may include, for example, the level of ESD that may be applied to the electronic system before the DUT (e.g., a semiconductor integrated circuit manufactured as a semiconductor package, that is, an integrated circuit package) included in electronic system experiences a soft failure. As discussed in further detail below, the ESD characteristic of the electronic system may vary according to the type of the DUT, a type of the housing surrounding the DUT, and the mounting position of the DUT inside the housing.

FIG. 2 is a flowchart illustrating a method of performing electrostatic discharge test according to example embodiments.

Referring to FIGS. 1 and 2, a weak frequency band of a device under test (DUT) is detected by sequentially radiating a plurality of first electromagnetic waves on a first test board including the DUT (S1000). As used herein, a "weak frequency band" refers to a range of electromagnetic wave frequencies (i.e., a "frequency band range") that when applied to the DUT, causes a soft failure. As used herein, a "soft failure" refers to a failure of the DUT, induced by an ESD event, that causes no physical damage to the DUT or leaves a physical trace within the DUT. For example, a soft failure may be the result of an ESD event introducing external signals to the DUT which may cause the DUT to enter a state in which the DUT does not function as intended. A soft failure may be corrected through error correcting software or through a rebooting of the DUT. During the testing of the DUT, the ESD event may be simulated using the plurality of first electromagnetic waves.

The step S1000 is performed by the first tester 1510 described above with reference to FIG. 1. The first tester 1510 includes a noise signal generator. The first tester 1510 sequentially radiates the plurality of first electromagnetic waves using the noise signal generator.

The DUT is mounted at a first position on the first test board, and is connected to the monitoring device 1130 through patterns formed on the first test board. In some embodiments, the first tester 1510 may sequentially radiate the plurality of first electromagnetic waves from above the DUT toward the DUT. Each of the plurality of first electromagnetic waves may have a different frequency band.

When the plurality of first electromagnetic waves are sequentially radiated to the DUT, the monitoring device 1130 receives result signals TRS generated corresponding to each of the plurality of first electromagnetic waves, and determines whether a soft failure occurs on the DUT based on the result signals TRS. As discussed above, the soft failure means that physical damage is not present in the DUT, but the DUT is in a state in which the DUT does not fully or normally execute (or perform) an intended function.

In some embodiments, the monitoring device 1130 may detect a weak frequency band of the DUT based on frequency bands of the plurality of first electromagnetic waves that cause the soft failure. Step S1000 will be described in detail with reference to FIGS. 3A, 3B, 3C, 4, 5 and 6.

First peak-to-peak voltage signals are detected by sequentially radiating the plurality of first electromagnetic waves on a second test board including an electromagnetic wave receiving module (S2000).

The step S2000 is performed by the first tester 1510 described above with reference to FIG. 1. The first tester 1510 includes the noise signal generator. The first tester 1510 sequentially radiates the plurality of first electromagnetic waves using the noise signal generator.

The electromagnetic wave receiving module is mounted at a second position on the second test board, and is connected to the monitoring device 1130 through the patterns formed on the second test board. In some embodiments, the first tester 1510 may sequentially radiate the plurality of first electromagnetic waves from above the electromagnetic wave receiving module toward the electromagnetic wave receiving module. The plurality of first electromagnetic waves may be substantially the same as those radiated to the DUT on the first test board in step S1000.

When the plurality of first electromagnetic waves are sequentially radiated to the electromagnetic wave receiving module, the monitoring device 1130 receives result signals TRS corresponding to each of the plurality of first electromagnetic waves, and detects voltage signals in a time domain corresponding to electromagnetic waves radiated to the electromagnetic wave receiving module based on the result signals TRS.

In some embodiments, the monitoring device 1130 may detect the first peak-to-peak voltage signals based on the voltage signals in the time domain. Step S2000 will be described in detail with reference to FIGS. 7A, 7B, 8, 9 and 10.

A frequency spectrum is detected by radiating a second electromagnetic wave on a housing including a third test board including the electromagnetic wave receiving module (S3000).

The step S3000 is performed by the second tester 1530 described above with reference to FIG. 1. The second tester 1530, unlike the first tester 1510, includes a static electricity generation device. The second tester 1530 radiates the second electromagnetic wave using the static electricity generation device. The electromagnetic wave receiving module is mounted at a specific position, hereinafter referred to as 'test position' of the third test board. That is, the first position and the second position may be arbitrary positions on the first test board and the second test board, and the test position may be a specific position on the third test board. The third test board may be disposed inside the housing.

In some embodiments, the test position may be distinguished from the first position in which the DUT is mounted on the first test board in step S1000 or the second position in which the electromagnetic wave receiving module is mounted on the second test board in step S2000. The test position is a position where the DUT is shipped as a finished product and then mounted in an electronic system. The test position may be determined based on a hardware specification of the electronic system including the DUT.

In some embodiments, the housing may be determined based on the hardware specification for manufacturing the electronic system as a means for efficiently arranging a circuit board including the DUT and protecting the DUT from external impact. The hardware specification may be provided in advance from the electronic system manufacturer that purchases the DUT and manufactures the electronic system.

The electromagnetic wave receiving module is connected to the monitoring device 1130 through the patterns formed on the third test board. In some embodiments, the second tester 1530 may radiate the second electromagnetic wave from the outside of the housing including the third test board toward the outer surface of the housing. The second electromagnetic wave may have a frequency band including all frequency bands of each of the plurality of first electromagnetic waves according to the steps S1000 and S2000.

When the second electromagnetic wave is radiated to the housing, the monitoring device 1130 receives result signals TRS generated corresponding to the second electromagnetic wave, and detects voltage signals in a frequency domain corresponding to electromagnetic wave radiated to the electromagnetic wave receiving module based on the result signals TRS.

In some embodiments, the monitoring device 1130 may detect the frequency spectrum based on the voltage signals in the frequency domain. Step S3000 will be described in detail with reference to FIGS. 11A, 11B, 12 and 13.

A second peak-to-peak voltage signal is generated based on the weak frequency band, the first peak-to-peak voltage signals and the frequency spectrum (S4000).

The step S4000 is performed by the ATE 1100 described above with reference to FIG. 1. The weak frequency band is detected by performing the step S1000, the first peak-to-peak voltage signals are detected by performing the step S2000, and the frequency spectrum is detected by performing the step S3000.

In some embodiments, compensation factors may be generated based on the weak frequency band and the first peak-to-peak voltage signals, and compensated amplitude values may be compensated based on the compensation factors. The second peak-to-peak voltage signal may be generated based on the compensated amplitude values.

In some embodiment, the compensation factors may be generated in advance after performing the step S2000, and the compensated amplitude values may be generated in advance after performing the step S3000. In another embodiment, the compensation factors and the compensated amplitude values may be generated after performing the step S3000 or during the step S4000. Step S4000 will be described in detail with reference to FIGS. 14, 15, 16, 17, 18 and 19.

An ESD characteristic associated with the electronic system including the DUT is predicted based on the second peak-to-peak voltage signal (S5000).

The step S5000 is performed by the ATE 1100 described above with reference to FIG. 1. In some embodiments, a reference peak-to-peak voltage signal may be provided in a process of performing the step S5000. In this case, the ESD characteristic may be predicted by comparing the reference peak-to-peak voltage signal with the second peak-to-peak voltage signal. Step S5000 will be described in detail with reference to FIGS. 20 and 21.

A database with respect to the DUT is generated at step S6000. The step S6000 is performed by the ATE 1100 described above with reference to FIG. 1.

In some embodiments, the database may include information on the DUT and information on the housing. The information on the DUT may include a model name of the DUT, a position where the DUT is mounted, a weak frequency band of the DUT and a peak-to-peak voltage signal in the weak frequency band. The information on the housing may include a model name of the housing. In some embodiments, the database may further include information on hardware specification corresponding to each of the DUT and the housing. Step S6000 will be described in detail with reference to FIGS. 22A, 22B, 23A, 23B, 24A and 24B.

Figure 3C:
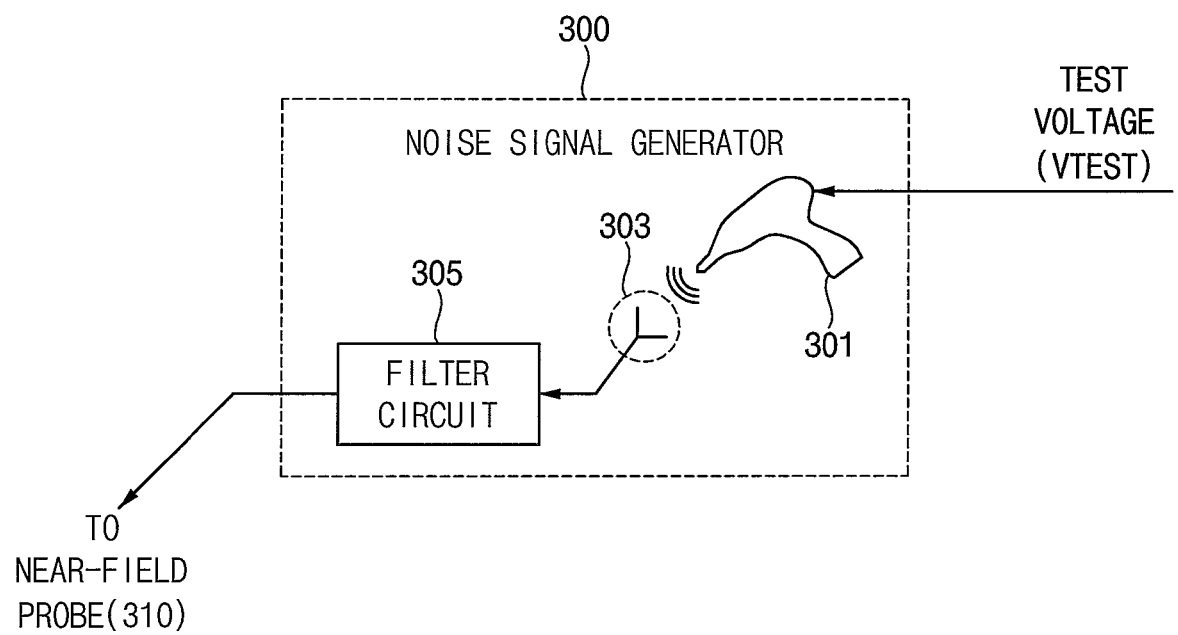

FIGS. 3A, 3B and 3C are diagrams illustrating an example of devices for detecting a weak frequency band in FIG. 2.

Referring to FIGS. 3A, 3B and 3C, devices capable of detecting a weak frequency band and performing the step S1000 in FIG. 2 include a host 100, a first transmission line 150, a first test board 200, an electromagnetic wave radiating module 310, a second transmission line 350 and a noise signal generator 300. The noise signal generator 300 includes a static electricity generation device 301, a receiving antenna 303 and a filter circuit 305. The first test board 200 includes a DUT 210.

In some embodiments, the host 100 may correspond to the monitoring device 1130 in FIG. 1, and the first test board 200, the electromagnetic wave radiating module 310 and the noise signal generator 300 may correspond to the first tester 1510 in FIG. 1.

The static electricity generation device 301 receives a test voltage VTEST and generates an electromagnetic wave based on the test voltage VTEST. In some embodiments, an output voltage of the static electricity generation device 301 is an open circuit voltage measured at a discharge electrode of the static electricity generation device 301 and may be between about 1 kV and about 15 kV according to the IEC 61000-4-2 standard. The static electricity generation device 301 may adjust a level of the output voltage based on the test voltage VTEST. The test voltage VTEST may be included in the control signal CTL1 provided from the host 100 and provided to the static electricity generation device 301.

The receiving antenna 303 receives electromagnetic waves generated by the static electricity generation device 301 and provides the electromagnetic waves to the filter circuit 305. The filter circuit 305 filters the electromagnetic wave based on the control signal CTL1 provided from the host 100. The electromagnetic wave is provided to the electromagnetic wave radiating module 310 through the second transmission line 350, and as a result of the filtering, an electromagnetic wave having a specific frequency band may be radiated by the electromagnetic wave radiating module 310.

The electromagnetic wave radiating module 310 may radiate the electromagnetic wave toward the DUT 210 from a position above the DUT 210, which may be mounted at an arbitrary position on the first test board 200. In some embodiments, the electromagnetic wave radiating module 310 may be implemented as a near-field probe. The end of the near-field probe may be formed in a square shape, but the shape is merely exemplary.

The host 100 drives the DUT 210 through the first transmission line 150. In some embodiments, the host 100 provides test pattern data to the DUT 210, and when the electromagnetic wave is radiated to the DUT 210, the host 100 may determine whether a soft failure occurs on the DUT 210 based on result signals generated by the DUT 210 corresponding to the electromagnetic wave. For example, the determination of a soft failure is based on result signals generated by the DUT 210 during a time period in which the DUT 210 is radiated with the electromagnetic wave.

Figure 4:
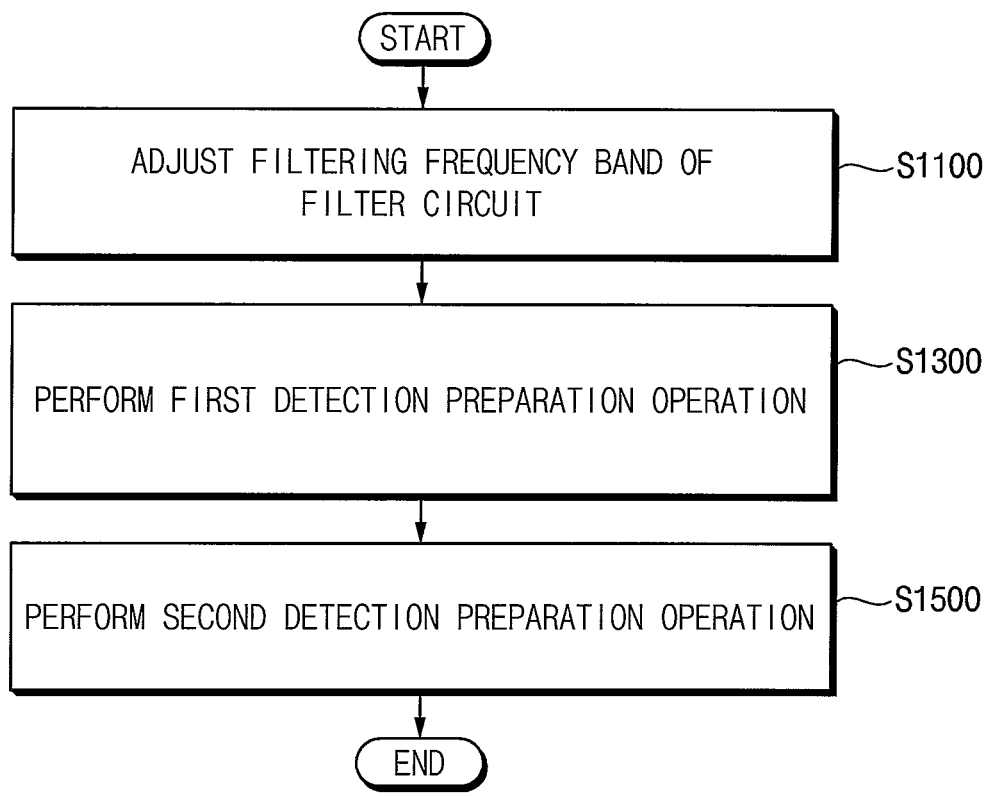
FIGS. 4 and 5 are flowcharts illustrating an example of a process of detecting a weak frequency band in FIG. 2.
Figure 5:
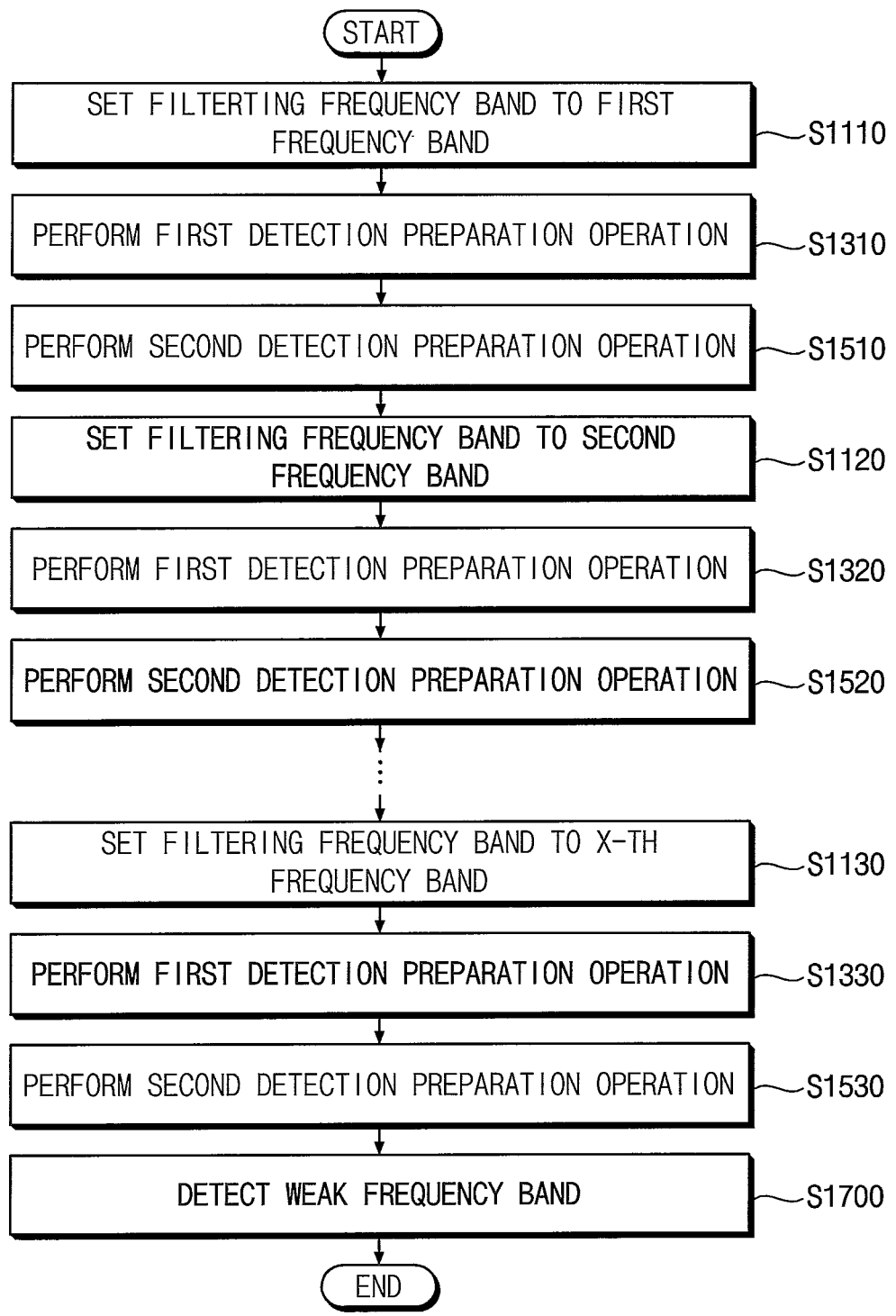

FIGS. 4 and 5 are flowcharts illustrating an example of a process of detecting a weak frequency band in FIG. 2.

Referring to FIGS. 3A, 3B, 3C and 4, a filtering frequency band of the filter circuit 305 is adjusted (S1100). A first detection preparation operation is performed (S1300). In the first detection preparation operation, a plurality of first electromagnetic waves are radiated on the first test board 200 by increasing an output voltage of the static electricity generation device 301 from a first voltage to a second voltage.

In some embodiments, the first voltage may be a minimum allowable voltage that the output voltage of the static electricity generation device 301 may be adjusted, and the second voltage may be a maximum allowable voltage that the output voltage may be adjusted.

In some embodiments, the filtering frequency band and the output voltage may be adjusted based on a control signal CTL1 provided from the host 100.

In some embodiments, after the filtering frequency band is adjusted to radiate the electromagnetic waves having a specific frequency band, the electromagnetic waves having various intensities may be radiated by adjusting the output voltage of the static electricity generation device 301.

A second detection preparation operation is performed (S1500). In the second detection preparation operation, it is determined whether a soft failure occurs on the DUT 210. When the soft failure occurs on the DUT 210, a reference output voltage may be set. The reference output voltage is a voltage between the minimum allowable voltage and the maximum allowable voltage, and may be set as the smallest voltage among the output voltages of the static electricity generation device 301 that causes the soft failure on the DUT 210 corresponding to a specific frequency band. The reference output voltage will be described in detail with reference to FIGS. 8 and 9.

Referring to FIGS. 3A, 3B, 3C, 4 and 5, a filtering frequency band of the filter circuit 305 is set to a first frequency band having a first center frequency (S1110). The first detection preparation operation is performed (S1310). The second detection preparation operation is performed (S1510). In some embodiments, the first detection preparation operation and the second detection preparation operation may be sequentially performed based on the first frequency band.

The filtering frequency band of the filter circuit 305 is set to a second frequency band having a second center frequency (S1120). The first detection preparation operation is performed (S1320). The second detection preparation operation is performed (S1520). In some embodiments, the first detection preparation operation and the second detection preparation operation may be sequentially performed based on the second frequency band.

The filtering frequency band of the filter circuit 305 is set to an X-th frequency band having an X-th center frequency, where X is a natural number greater than or equal to three (S1120). The first detection preparation operation is performed (S1320). The second detection preparation operation is performed (S1520). In some embodiments, the first detection preparation operation and the second detection preparation operation may be sequentially performed based on the second frequency band.

The filtering frequency band is sequentially adjusted from a minimum frequency band to a maximum frequency band among filtering frequency bands that may be adjusted by controlling the filter circuit 305. A frequency band of each of the plurality of first electromagnetic waves is determined based on the filtering frequency bands. In some embodiments, a frequency band of each of the plurality of first electromagnetic waves and the filtering frequency band may be substantially the same as each other.

In some embodiments, the first frequency band and the second frequency band adjacent to the first frequency band may partially overlap each other.

In some embodiments, the filtering frequency bands may be adjusted based on whether the soft failure occurs on the DUT 210. For example, each of the first frequency band and the X-th frequency band may be filtering frequency bands corresponding to a frequency band in which the soft failure does not occur on the DUT 210. On the other hand, the second frequency band may be filtering frequency bands corresponding to a frequency band in which the soft failure occurs on the DUT 210. That is, it may be determined that the soft failure occurs on the DUT when the second detection preparation operation is performed based on the first frequency band and the X-th frequency band, and it may be determined that the soft failure does not occur on the DUT when the second detection preparation operation is performed based on the second frequency band. In this case, the weak frequency band is detected between a center frequency of the first frequency band and the center frequency of the X-th frequency band (S1700).

FIG. 6 is a diagram illustrating a process of detecting a weak frequency band in FIG. 2.

In FIG. 6, examples of frequencies, e.g., about 1.96 GHz to 2.48 GHz, and results of a soft failure test respectively corresponding to the frequencies are illustrated.

Each of the frequencies represents a center frequency of a filtering frequency band of the filter circuit 305 or a center frequency of a frequency band of each of the plurality of first electromagnetic waves corresponding to the filtering frequency band. The results of the soft failure test represents whether a soft failure has occurred in the DUT 210 when the plurality of first electromagnetic waves are radiated to the first test board.

Referring to FIG. 6, when the plurality of first electromagnetic waves having center frequencies of 1.96, 2.44 and 2.47 GHz are radiated to the first test board, the soft failure may not occur on the DUT (i.e., PASS). On the other hand, when the plurality of first electromagnetic waves having center frequencies of 2.00, 2.04, 2.08, 2.12, 2.16, 2.20, 2.24, 2.28, 2.32, 2.36 and 2.40 GHz are radiated to the first test board, the soft failure may occur on the DUT, i.e., FAIL. In this case, the weak frequency band of the DUT 210 may be detected as a frequency band from about 2.00 GHz to 2.40 GHz based on the filtering frequency band in which the soft failure occurs. Hereinafter, example embodiments will be described based on the weak frequency band corresponding to the frequency band from 2.00 GHz to 2.40 GHz.

FIGS. 7A and 7B are diagrams illustrating an example of devices for detecting first peak-to-peak voltage signals in FIG. 2.

Referring to FIGS. 3A, 3B, 3C, 7A and 7B, devices for detecting a first peak-to-peak voltage signals include an oscilloscope 110, a third transmission line 151, a second test board 201, an electromagnetic wave radiating module 310, a fourth transmission line 350 and a noise signal generator 300. The noise signal generator 300 includes a static electricity generation device 301, a receiving antenna 303 and a filter circuit 305. Components having the same reference numerals as those of FIGS. 3A, 3B and 3C perform the same or similar functions, and thus redundant descriptions will be omitted.

In some embodiments, the oscilloscope 110 may be included in the monitoring device 1130 in FIG. 1, and the second test board 201, the electromagnetic wave radiating module 310 and the noise signal generator 300 may be included in the first tester 1510 in FIG. 1.

The noise signal generator 300 and the electromagnetic wave radiating module 310 perform the same functions as the noise signal generator 300 and the electromagnetic wave radiating module 310 illustrated in FIGS. 3A, 3B and 3C. That is, the noise signal generator 300 may provide an electromagnetic wave having a specific frequency band to the electromagnetic wave radiating module 310, and the electromagnetic wave radiating module 310 may radiate the electromagnetic waves toward the electromagnetic wave receiving module 230 from a position above the electromagnetic wave receiving module 230, which may be formed at an arbitrary position on the second test board 201.

The second test board 201, unlike the first test board 200 illustrated in FIGS. 3A and 3B, includes an electromagnetic wave receiving module 230 instead of the DUT 210. In one embodiment, the second test board 201 may be prepared separately from the first test board 200 described above with reference to FIGS. 3A, 3B and 3C, in another embodiment, the second test board 201 may be prepared by reusing the first test board 200.

The electromagnetic wave receiving module 230 includes a conductive pattern 231, a transmission line 233 and a shielding member 235. The conductive pattern 231 is formed on an upper surface of the second test board 201 to receive an electromagnetic wave radiated from the electromagnetic wave radiating module 310, and the transmission line 233 transmits the electromagnetic wave to the oscilloscope 110 through the third transmission line 151. The shielding member 235 shields an outflow of the electromagnetic wave to the outside environment such that the electromagnetic wave is efficiently transmitted to the oscilloscope 110.

The oscilloscope 110 detects voltage signals in a time domain of the electromagnetic waves received by the electromagnetic wave receiving module 230 through the third transmission line 151. The monitoring device 1130 may detect first peak-to-peak voltage signals based on the voltage signals in the time domain.

Figure 8:
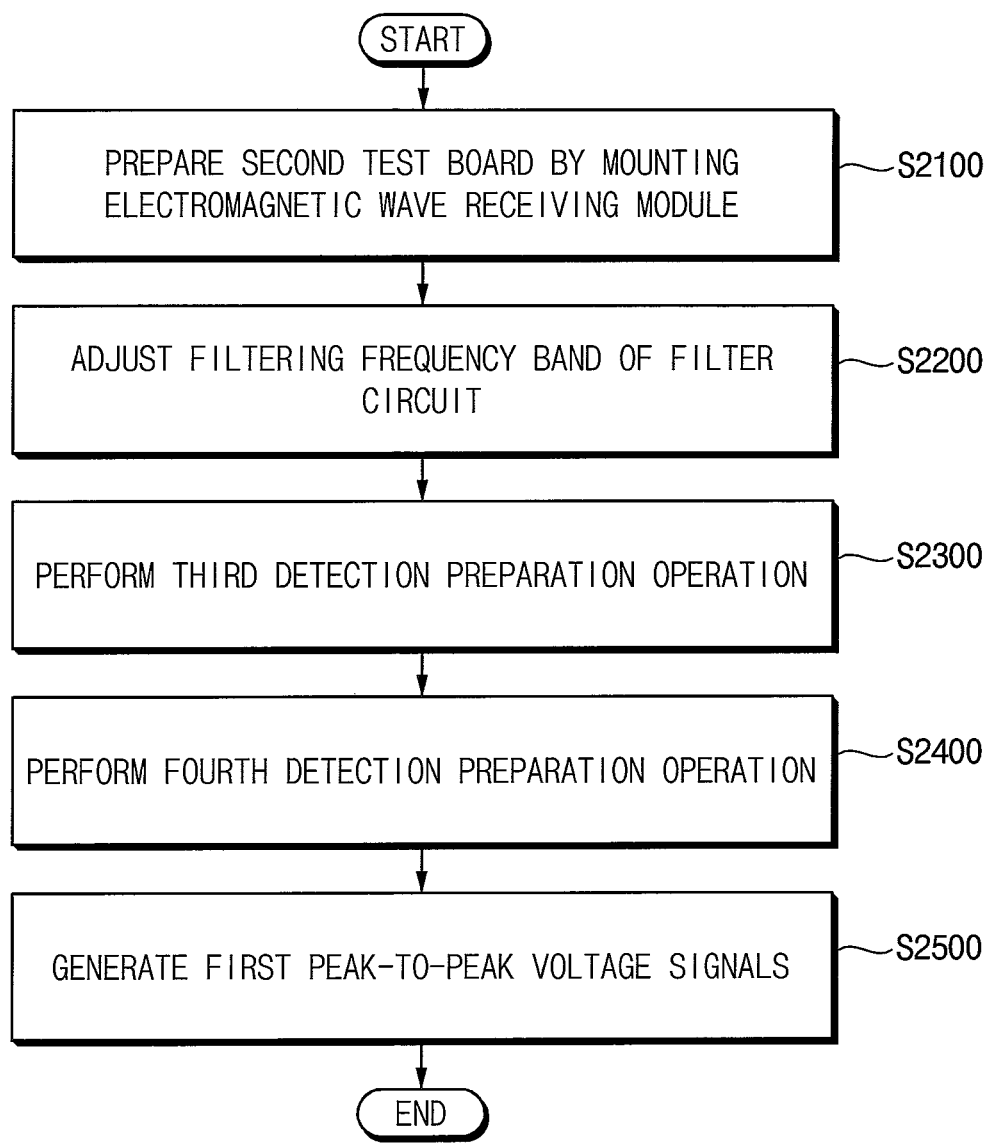
FIGS. 8 and 9 are flowcharts illustrating an example of a process of detecting first peak-to-peak voltage signals in FIG. 2.
Figure 9:
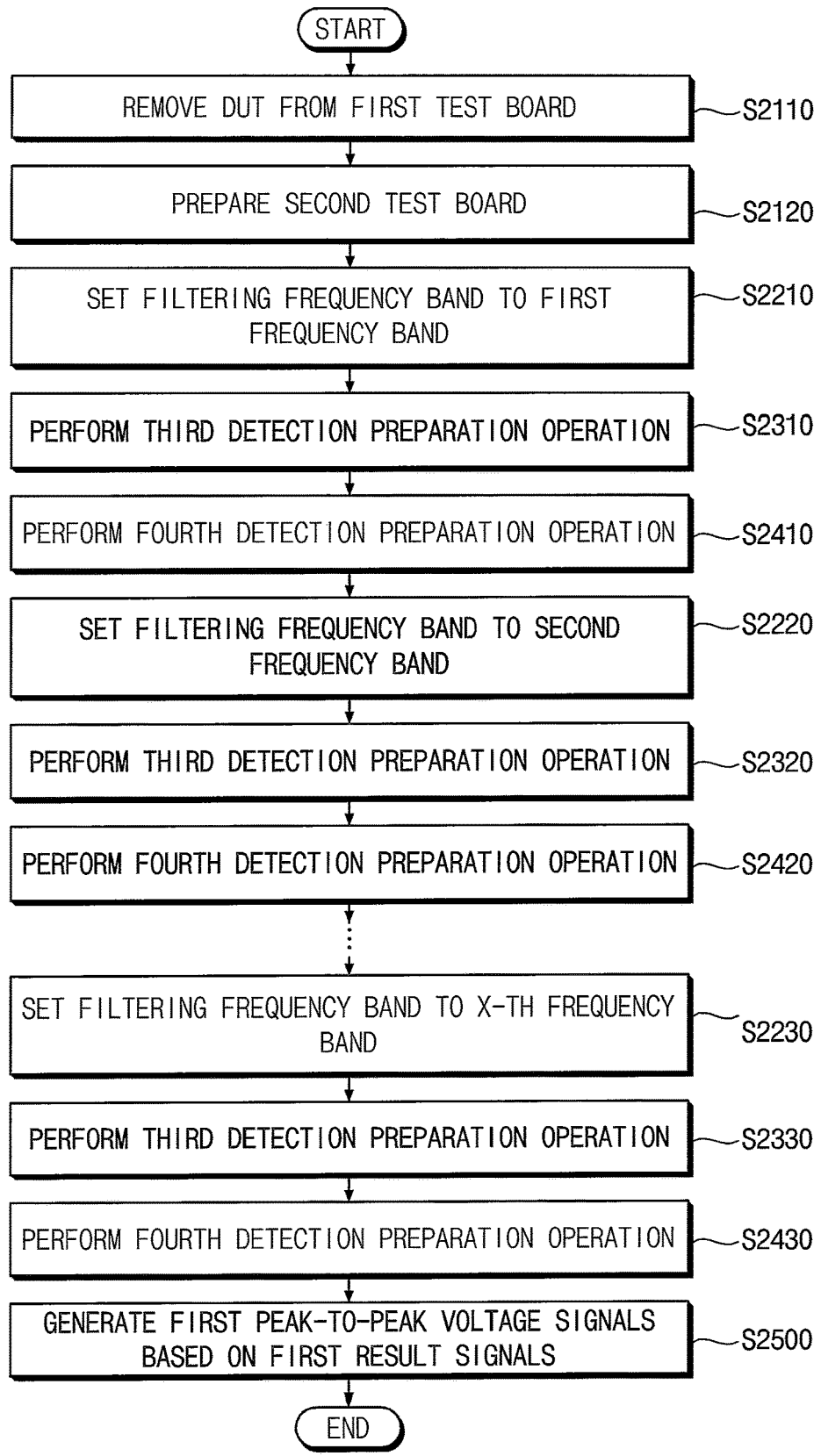

FIGS. 8 and 9 are flowcharts illustrating an example of a process of detecting first peak-to-peak voltage signals in FIG. 2.

Referring to FIGS. 7A, 7B and 8, a second test board is prepared by mounting an electromagnetic wave receiving module (S2100). A filtering frequency band of a filter circuit is adjusted (S2200).

Referring to FIGS. 7A, 7B and 8, a second test board is prepared by mounting an electromagnetic wave receiving module (S2100). A filtering frequency band of the filter circuit is adjusted (S2200). A third detection preparation operation is performed (S2300). In the third detection preparation operation, a plurality of first electromagnetic waves are radiated on the second test board by setting the output voltage of the static electricity generation device to be higher than a reference output voltage. A fourth detection preparation operation is performed (S2400). In the fourth detection preparation operation, first result signals generated by sequentially radiating a plurality of first electromagnetic waves on the second test board are received. First peak-to-peak voltage signals are generated based on the first result signals (S2500).

The steps S2200 and S2300 correspond to steps S1100 and S1300 described above with reference to FIG. 4, and correspond to steps S1110, S1120, S1130, S1310, S1320 and S1330 described above with reference to FIG. 5. Accordingly, the filtering frequency band may be adjusted to be the same as the filtering frequency band of the filter circuit 305 adjusted in steps S1100, S1110, S1120, S1130, S1300, S1310, S1320 and S1330.

The reference output voltage may be the smallest voltage among output voltages of the static electricity generation device 301 that causes the soft failure on the DUT according to steps S1500, S1510, S1520 and S1530 as described above with reference to FIGS. 4 and 5.

The first result signals are detected by the oscilloscope 110. In some embodiments, the first result signals may be detected as voltage signals in a time domain, and may be detected for each filtering frequency band according to steps S2200 and S2300. Accordingly, the first peak-to-peak voltage signals may be generated for each of the filtering frequency bands based on the first resulting signals.

Referring to FIGS. 7A, 7B and 9, the DUT 210 is removed from the first test board 200 (S2110). The second test board 201 is prepared by mounting the electromagnetic wave receiving module 230 on a position where the DUT 210 is removed on the first test board 200 (S2120). As described above with reference to FIGS. 7A and 7B, in some embodiments, the second test board 201 may be prepared separately from the first test board 200, but in some embodiments, the second test board 201 may be prepared by reusing the first test board 200.

A filtering frequency band of the filter circuit 305 is set to a first frequency band having a first center frequency (S2210). The third detection preparation operation is performed (S2310). The fourth detection preparation operation is performed (S2410). In some embodiments, the third detection preparation operation and the fourth detection preparation operation may be sequentially performed based on the first frequency band.

A filtering frequency band of the filter circuit 305 is set to a second frequency band having a second center frequency (S2220). The third detection preparation operation is performed (S2320). The fourth detection preparation operation is performed (S2420). In some embodiments, the third detection preparation operation and the fourth detection preparation operation may be sequentially performed based on the second frequency band.

A filtering frequency band of the filter circuit 305 is set to an X-th frequency band having an X-th center frequency, where X is a natural number greater than or equal to three (S2230). The third detection preparation operation is performed (S2330). The fourth detection preparation operation is performed (S2430). In some embodiments, the third detection preparation operation and the fourth detection preparation operation may be sequentially performed based on the X-th frequency band.

The filtering frequency band is sequentially adjusted from a minimum frequency band to a maximum frequency band among filtering frequency bands that may be adjusted by controlling the filter circuit 305. The filtering frequency band is adjusted in the same manner as described above with reference to FIG. 5.

A frequency band of each of the plurality of first electromagnetic waves is determined based on the filtering frequency bands. In some embodiments, a frequency band of each of the plurality of first electromagnetic waves and the filtering frequency band may be substantially the same as each other.

The first peak-to-peak voltage signals are generated based on the first result signals (S2500).

Figures 10, 11A:
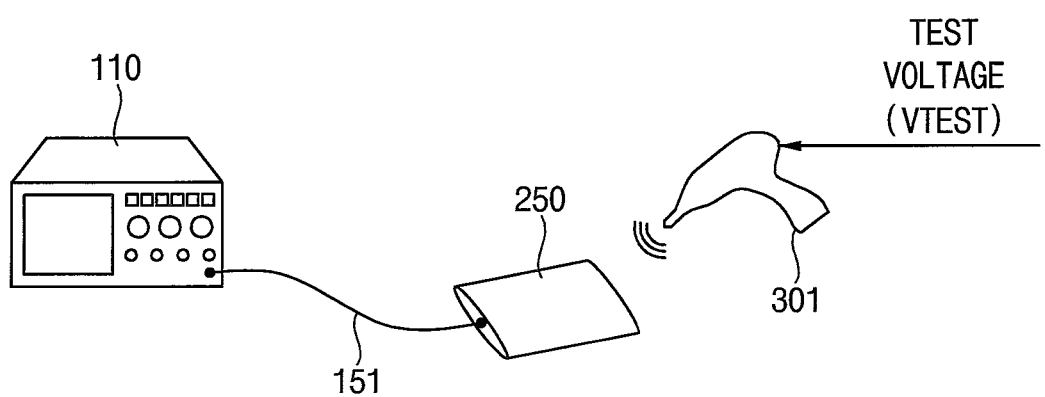
FIG. 10 is a diagram illustrating an example of first peak-to-peak voltage signals.
FIGS. 11A and 11B are diagrams illustrating examples of devices for detecting a frequency spectrum in FIG. 2.

FIG. 10 is a diagram illustrating an example of first peak-to-peak voltage signals.

In FIG. 10, examples of frequencies, e.g., about 1.96 GHz to 2.48 GHz and first peak-to-peak voltage signals VPP1 respectively corresponding to the frequencies are illustrated.

Each of the frequencies represents a center frequency of a filtering frequency band of the filter circuit 305 or a center frequency of a frequency band of each of the plurality of first electromagnetic waves corresponding to the filtering frequency band. The first peak-to-peak voltage signals VPP1 represents peak-to-peak voltage signals detected by the monitoring device 1130 based on voltage signals in a time domain detected by the oscilloscope 110 when the plurality of first electromagnetic waves are radiated to the second test board.

Referring to FIG. 10, when the plurality of first electromagnetic waves having center frequencies of 1.96, 2.00, 2.04, 2.08, 2.12, 2.16 and 2.20 GHz are radiated to the second test board including the electromagnetic wave receiving module 230, the peak-to-peak voltage signals may represent 5.5, 4.4, 4.6, 4.3, 4.2, 4.1 and 3.8 V, respectively. When the plurality of first electromagnetic waves having center frequencies of 2.24, 2.28, 2.32, 2.36, 2.40, 2.44 and 2.48 GHz are radiated to the second test board including the electromagnetic wave receiving module 230, the peak-to-peak voltage signals may represent 3.5, 3.9, 5.4, 6.5, 8.5, 9 and 9.5 V, respectively.

Figure 11B:
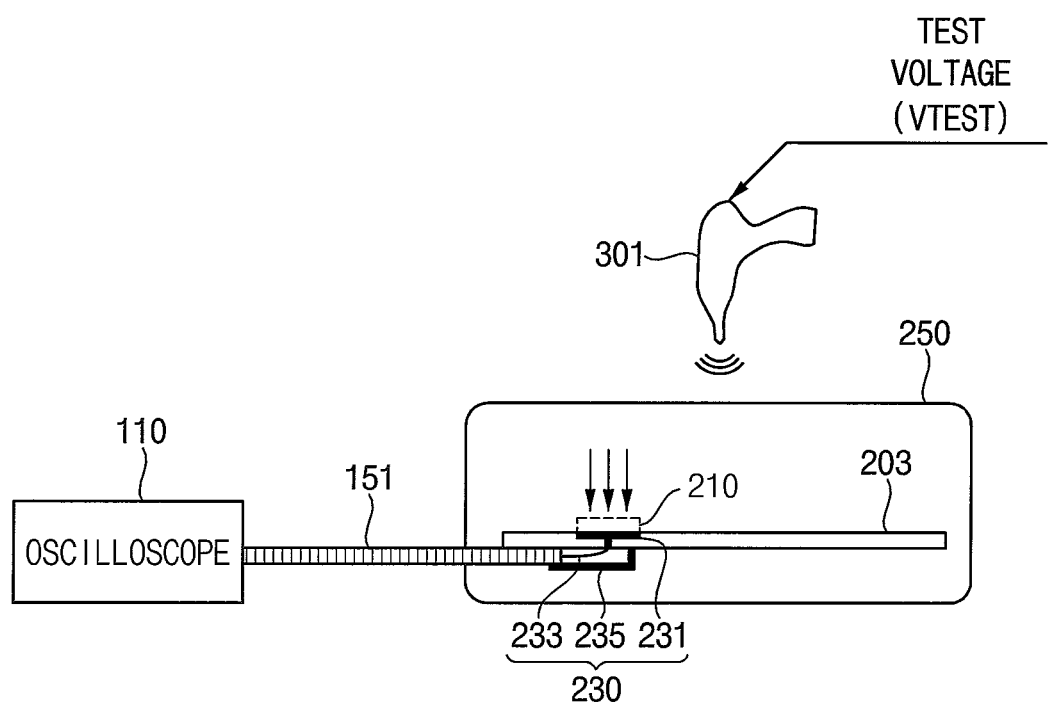

FIGS. 11A and 11B are diagrams illustrating examples of devices for detecting a frequency spectrum in FIG. 2.

Referring to FIGS. 11A and 11B, devices that detect a frequency spectrum perform the step S3000 in FIG. 2, and include an oscilloscope 110, a third transmission line 151, a housing 250 and a static electricity generation device 301. Components having the same reference numerals as those of FIGS. 3A, 3B, 3C, 7A and 7B perform the same or similar function, and thus redundant descriptions will be omitted.

In some embodiments, the oscilloscope 110 may be included in the monitoring device 1130 in FIG. 1, and the housing 250 and the static electricity generation device 301 may be included in the second tester 1530 in FIG. 1.

The static electricity generation device 301 performs the same functions as the static electricity generation device 301 illustrated in FIGS. 3A, 3B, 3C, 7A and 7B. That is, the static electricity generation device 301 receives a test voltage VTEST and radiates an electromagnetic wave from the outside of the housing 250 toward the outer surface of the housing 250 based on the test voltage VTEST.

The devices that detect the frequency spectrum, unlike the devices that detect the weak frequency band described above with reference to FIGS. 3A, 3B and 3C, or the devices that detect the first peak-to-peak voltage signals described above with reference to FIGS. 7A and 7B, do not include a filter circuit. Accordingly, the electromagnetic wave radiated to the housing 250 by the static electricity generation device 301 may have a frequency band including all frequency bands of each of the plurality of first electromagnetic waves according to the steps S1000 and S2000.

The housing 250 includes a third test board 203, and the third test board 203 is disposed inside the housing 250. An electromagnetic wave receiving module 230 is mounted at the test position on the third test board 203. The electromagnetic wave receiving module 230 has the same structure and performs the same function as the electromagnetic wave receiving module 230 described above with reference to FIGS. 7A and 7B.

The oscilloscope 110 receives test result signals TRS generated corresponding to the electromagnetic wave received by the electromagnetic wave receiving module 230 through the third transmission line 151, and the monitoring device 1130 detects voltage signals in a frequency domain corresponding to the electromagnetic wave based on the test result signals TRS, and detects the frequency spectrum based on the voltage signals in the frequency domain.

Figure 12:
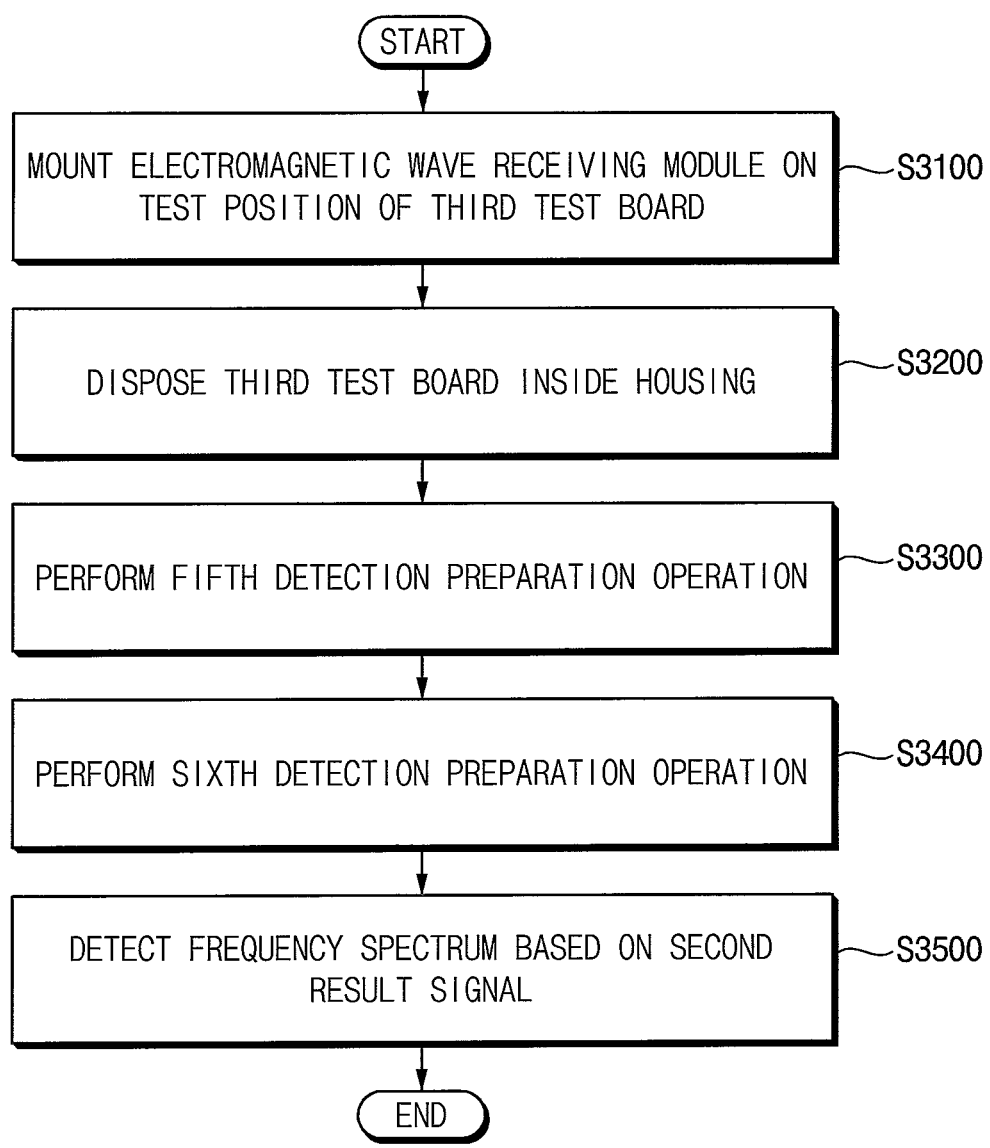
FIG. 12 is a flowchart illustrating an example of a process of detecting a frequency spectrum in FIG. 2.
Figure 13:
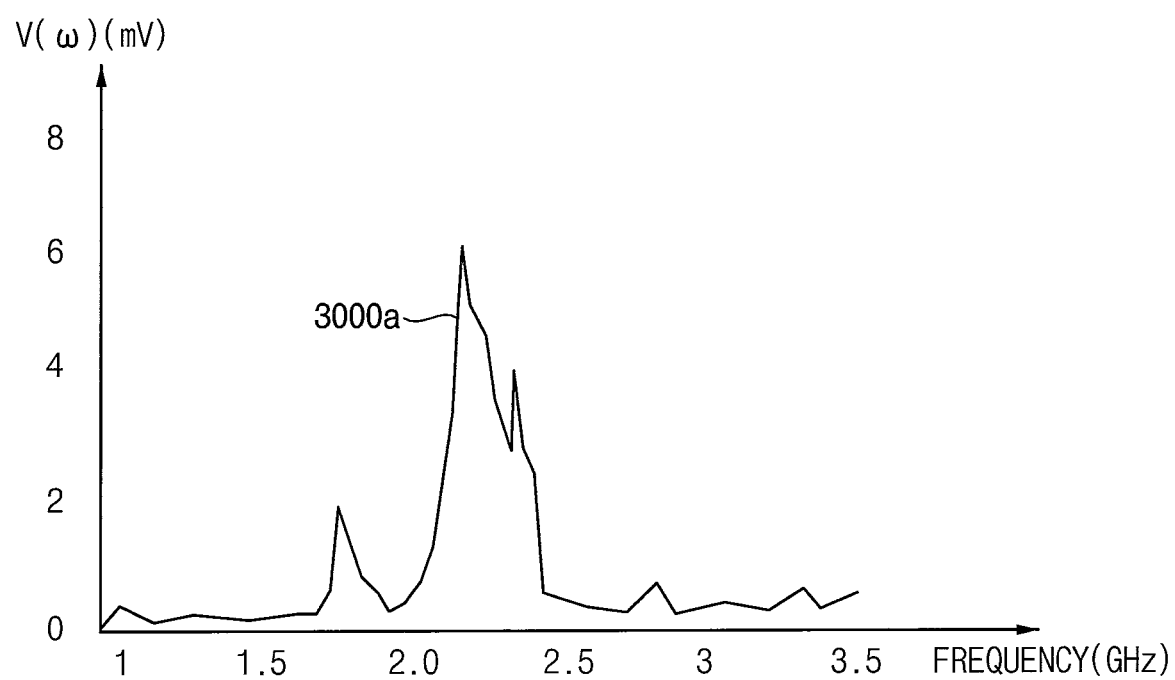
FIG. 13 is a graph illustrating an example of a frequency spectrum.

FIG. 12 is a flowchart illustrating an example of a process of detecting a frequency spectrum in FIG. 2. FIG. 13 is a graph illustrating an example of a frequency spectrum.

Referring to FIGS. 11A, 11B, 12 and 13, an electromagnetic wave receiving module 230 is mounted on a test position of a third test board 203 (S3100). The third test board 203 is disposed inside a housing 250 (S3200).

A fifth detection preparation operation is performed (S3300). In the fifth detection preparation operation, a second electromagnetic wave is radiated on the housing 250 by setting an output voltage of a static electricity generation device to be higher than a reference output voltage. The reference output voltage may be the smallest voltage among output voltages of the static electricity generation device 301 that causes the soft failure on the DUT according to steps S1500, S1510, S1520 and S1530 as described above with reference to FIGS. 4 and 5. The second electromagnetic wave is an electromagnetic wave that is not filtered by a filter circuit, and may have a frequency band including all frequency bands of each of the plurality of first electromagnetic waves according to steps S1000 and S2000.

A sixth detection preparation operation is performed (S3400). In the sixth detection preparation operation, a second result signal generated by radiating the second electromagnetic wave on the housing 250 is received.

A frequency spectrum is detected based on the second result signal (S3500). In some embodiments, the monitoring device 1130 may detect voltage signals in a frequency domain of the electromagnetic wave based on the second result signal, and may detect the frequency spectrum based on the voltage signals in the frequency domain.

In FIG. 13, an example of the frequency spectrum 3000a is illustrated. Referring to FIG. 13, the X-axis represents frequency, and the Y-axis represents voltage signals in the frequency domain.

Figure 14:
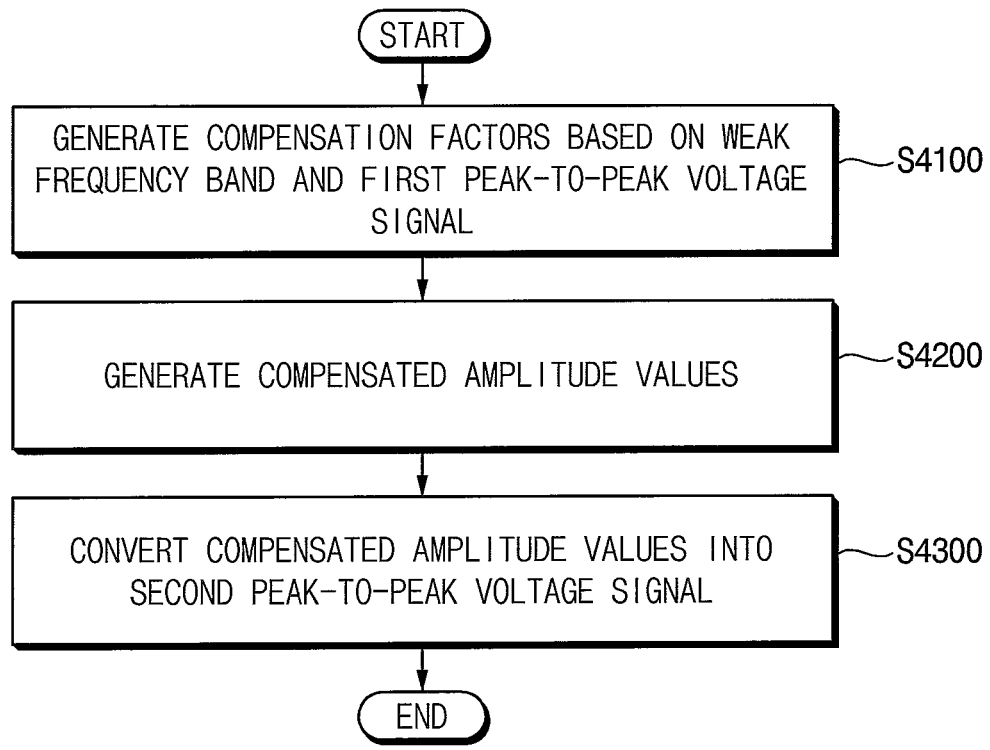
FIG. 14 is a flowchart illustrating an example of a process of generating a second peak-to-peak voltage signal in FIG. 2.
Figure 15:
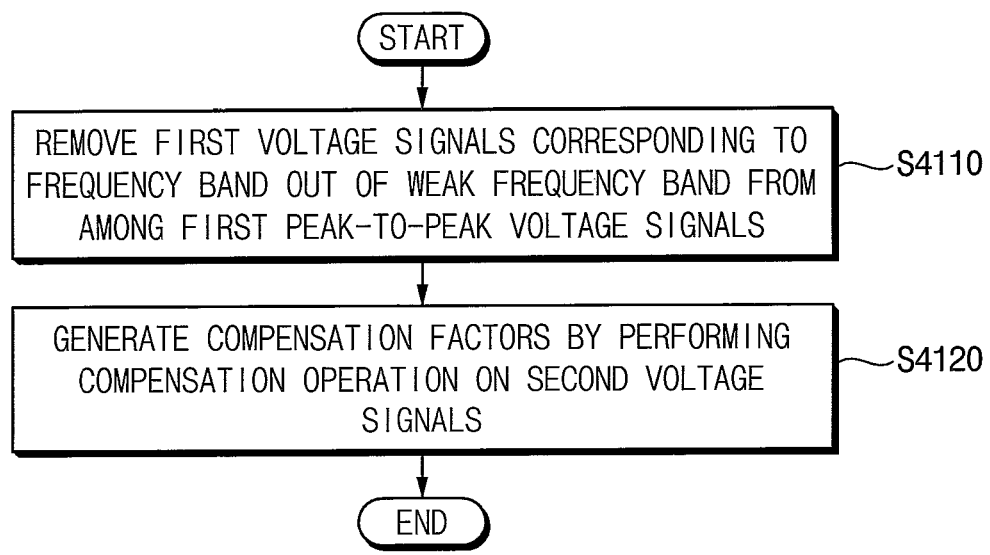
FIG. 15 is a flowchart illustrating an example of a process of generating compensation factors in FIG. 14.
Figures 16, 17:
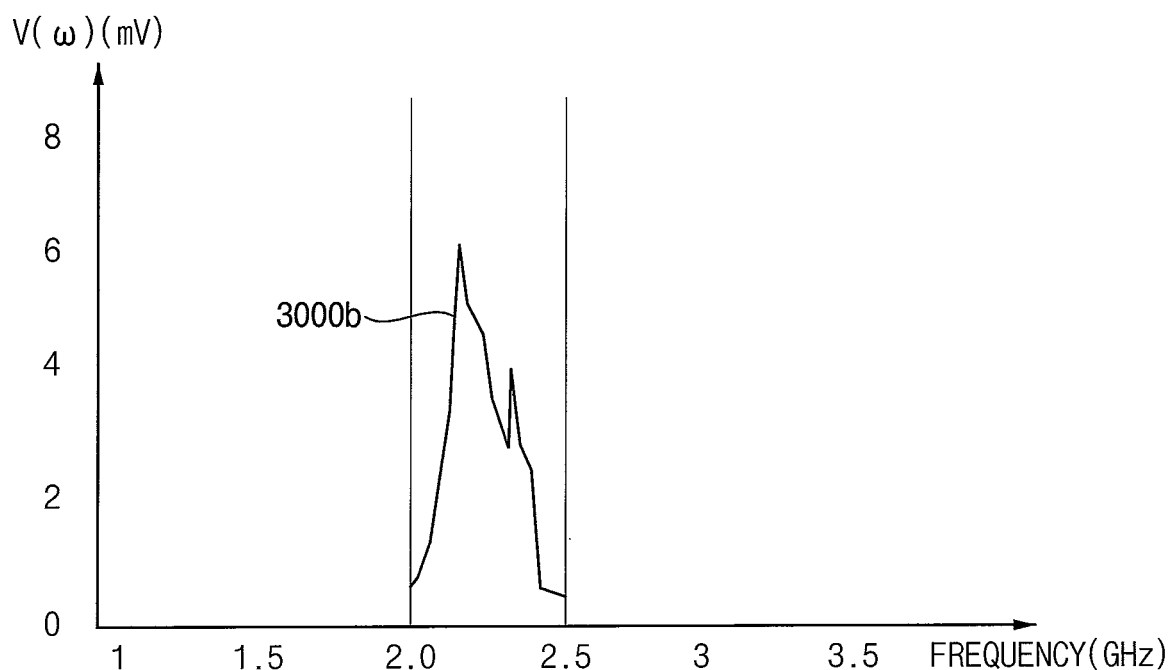
FIG. 16 is a diagram illustrating an example of compensation factors.
FIG. 17 is a diagram illustrating an example of amplitude values before compensation on a frequency spectrum.

FIG. 14 is a flowchart illustrating an example of a process of generating a second peak-to-peak voltage signal in FIG. 2. FIG. 15 is a flowchart illustrating an example of a process of generating compensation factors in FIG. 14. FIG. 16 is a diagram illustrating an example of compensation factors.

Referring to FIG. 14, compensation factors are generated based on a weak frequency band and a first peak-to-peak voltage signal. (S4100). The weak frequency band is generated according to the steps S1000 or S1700. The first peak-to-peak voltage signals are generated according to the step S2000 or S2500. The process of generating the compensation factors will be described in detail.

Referring to FIG. 15, first voltage signals corresponding to a frequency band out of a weak frequency band from among first peak-to-peak voltage signals are removed (S4110). Compensation factors are generated by performing a compensation operation on second voltage signals corresponding to the weak frequency band other than the first voltage signals from among the first peak-to-peak voltage signals (S4120). The weak frequency band corresponds to the frequency band from 2.00 GHz to 2.40 GHz as described above with reference to FIG. 6. The compensation operation may be an operation that returns a reciprocal number for each of the first peak-to-peak voltage signals corresponding to the weak frequency band.

Referring to FIG. 16, first voltage signals corresponding to a frequency band out of the weak frequency band, e.g., a frequency band less than 2.00 GHz and greater than 2.40 GHz, from among the first peak-to-peak voltage signals VPP1 may be removed. For example, the first voltage signal corresponding to a frequency band represented by a center frequency of 1.96 GHz may be removed, the first voltage signal corresponding to a frequency band represented by a center frequency of 2.44 GHz may be removed, and the first voltage signal corresponding to a frequency band represented by a center frequency of 2.48 GHz may be removed.

Compensation factors VPP-1 may be generated by performing the compensation operation on second voltage signals corresponding to the weak frequency band, e.g. a frequency band more than 2.00 GHz and less than 2.40 GHz, other than the first voltage signals from among the first peak-to-peak voltage signals. For example, a reciprocal value, i.e., 0.23 V=1/4.4 V, for the second voltage signal, i.e., 4.4 V, corresponding to a frequency band having a center frequency of 2.00 GHz may be generated as a compensation factor VPP-1. A reciprocal value, i.e., 0.22 V=1/4.6 V, for the second voltage signal, i.e., 4.6 V, corresponding to a frequency band having a center frequency of 2.04 GHz may be generated as a compensation factor VPP-1. Further, for other frequency bands included in the weak frequency band, e.g., frequency bands having center frequencies of 2.08, 2.12, 2.16, 2.20, 2.24, 2.28, 2.32, 2.36 and 2.48 GHz, the compensation factors VPP-1 are generated by performing the compensation operation in the same manner as the method of generating the compensation factors VPP-1 corresponding to the frequency bands having center frequencies of 2.00 GHz or 2.04 GHz.

As a result of the compensation operation, compensation factors VPP-1 may be generated corresponding to the weak frequency band of the DUT 210.

Referring back to FIG. 14, compensated amplitude values are generated by compensating amplitude values on a frequency spectrum based on the compensation factors VPP-1 (S4200). The frequency spectrum is detected according to step S3500. In FIG. 13, an example 3000a of the frequency spectrum is illustrated.

Figure 18:
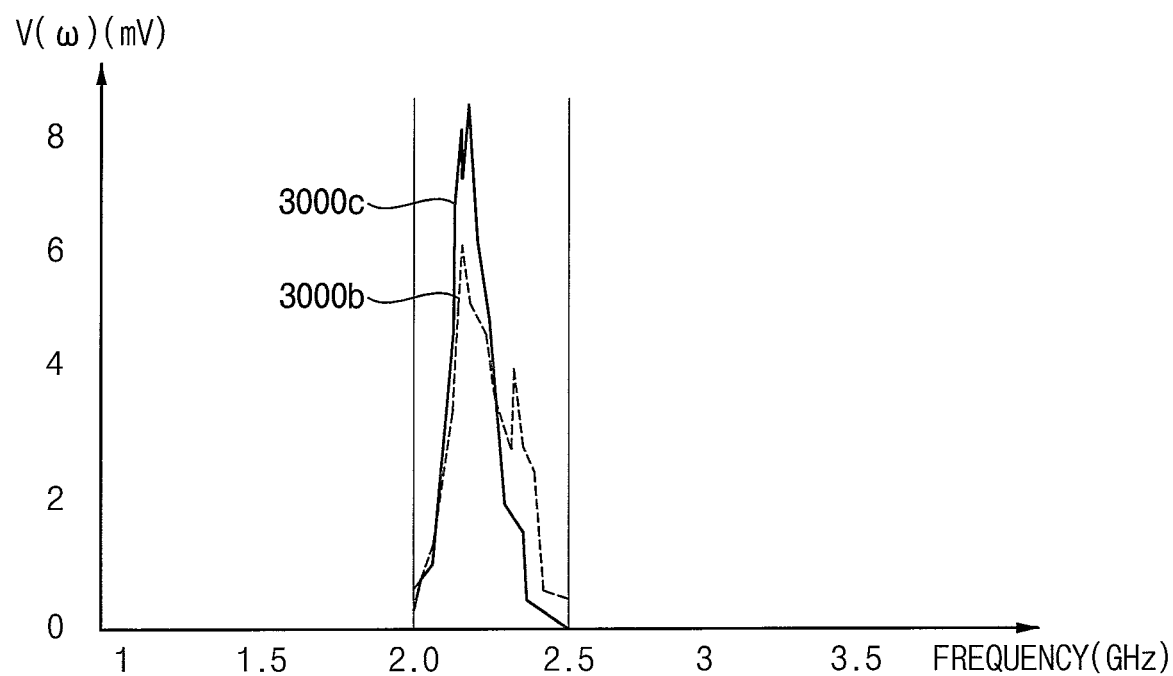
FIG. 18 is a diagram illustrating an example of amplitude values after compensation on a frequency spectrum.

FIG. 17 is a diagram illustrating an example of amplitude values before compensation on a frequency spectrum. FIG. 18 is a diagram illustrating an example of amplitude values after compensation on a frequency spectrum.

Referring to FIG. 17, with respect to the amplitude values of the frequency spectrum 3000a of FIG. 13, only amplitude values 3000b of the frequency spectrum corresponding to the weak frequency band, e.g., frequency bands more than 2.00 GHz and less than 2.40 GHz, may be selected. In some embodiments, amplitude values of a frequency spectrum corresponding to a frequency band out of the weak frequency band may be removed.

Referring to FIG. 18, each of amplitude values 3000b of a frequency spectrum corresponding to the weak frequency band may be multiplied by the corresponding compensation factors VPP-1 in a frequency domain. For example, the amplitude values 3000b of the frequency spectrum may be multiplied by the compensation factors VPP-1 to obtain the amplitude values 3000c of the frequency spectrum as the compensated amplitude values.

The compensated amplitude values are converted into a second peak-to-peak voltage signal (S4300). In some embodiments, the compensated amplitude values are values in the frequency domain, the second peak-to-peak voltage signal VPP2 may be generated by converting the compensated amplitude values into a time domain and measuring peak-to-peak voltages of signals according to the conversion.

Figure 19:
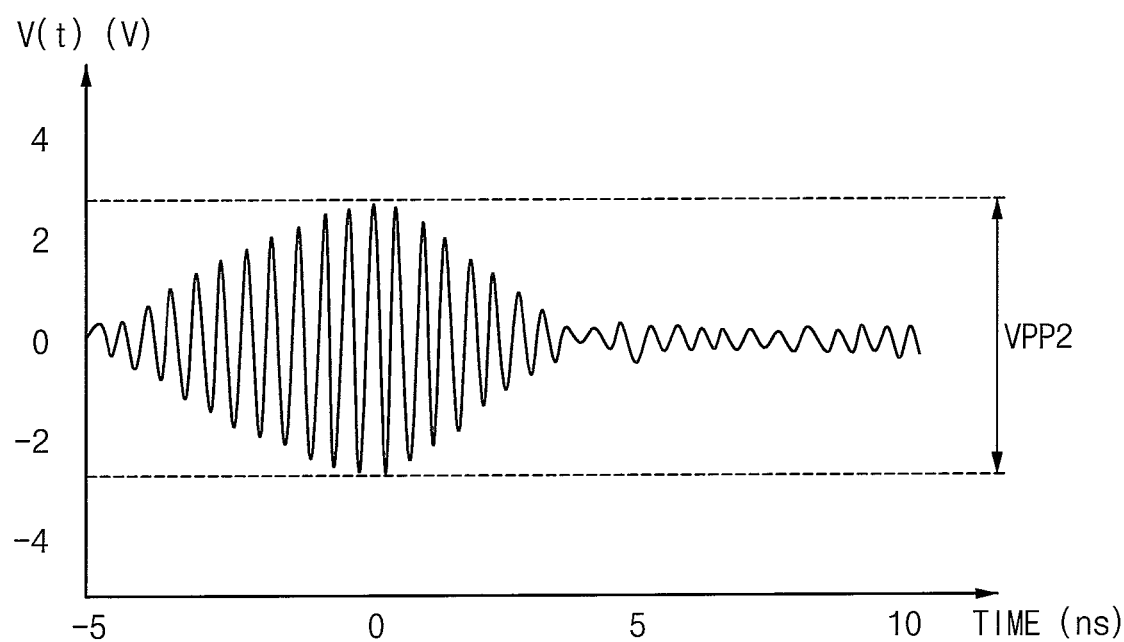
FIG. 19 is a diagram illustrating an example of a second peak-to-peak voltage signal.

FIG. 19 is a diagram illustrating an example of a second peak-to-peak voltage signal.

Referring to FIG. 19, a second peak-to-peak voltage signal VPP2 may be generated by converting the compensated amplitude values illustrated in FIG. 18 into a time domain and measuring a peak-to-peak voltage of signals according to the conversion. In some embodiments, an inverse fast Fourier transform (IFTT) may be performed in a process of transforming the compensated amplitude values into the time domain. The IFTT may be performed by the ATE 1100 described above with reference to FIG. 1.

Figure 20:
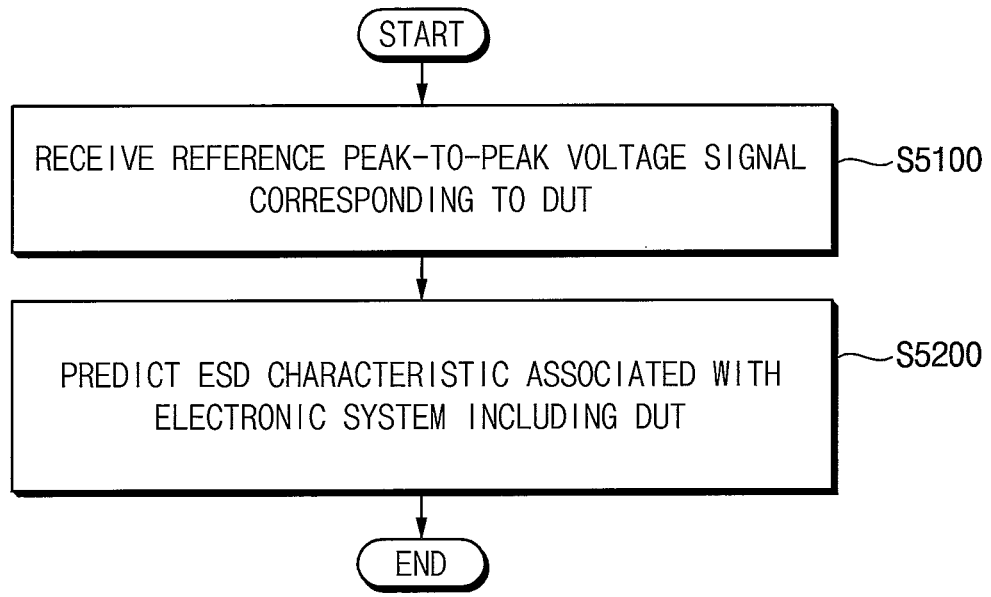
FIG. 20 is a flowchart illustrating an example of a process of predicting an electrostatic discharge (ESD) characteristic associated with an electronic system including a device under test (DUT).

FIG. 20 is a flowchart illustrating an example of a process of predicting an electrostatic discharge (ESD) characteristic associated with an electronic system including a device under test (DUT).

Referring to FIG. 20, a reference peak-to-peak voltage signal corresponding to DUT is received. The reference peak-to-peak voltage signal represents a peak-to-peak voltage in a time domain of an electromagnetic wave that causes a soft failure in the DUT.

In some embodiments, the reference peak-to-peak voltage signal may be generated by generating a voltage signal in a time domain based on only first peak-to-peak voltage signals corresponding to the weak frequency band among the first peak-to-peak voltage signals and measuring or calculating a peak-to-peak voltage of the voltage signals generated in the time domain. In this case, the reference peak-to-peak voltage signal may be generated using devices that detect the first peak-to-peak voltage signals described above with reference to FIGS. 7A and 7B.

In some embodiments, the reference peak-to-peak voltage signal may be generated by generating a voltage signal in a time domain based on all of the first peak-to-peak voltage signals and measuring or calculating a peak-to-peak voltage of the voltage signals generated in the time domain. In this case, the reference peak-to-peak voltage signal may be generated using devices that detect the first peak-to-peak voltage signals described above with reference to FIGS. 7A and 7B. In addition, the reference peak-to-peak voltage signal may be generated by using the static electricity generation device 301 in FIGS. 3C, 11A and 11B instead of the noise signal generator 300 in FIGS. 7A and 7B.

An ESD characteristic associated with an electronic system including the DUT is predicted by comparing the reference peak-to-peak voltage signal with the second peak-to-peak voltage signal (S5200). Each of the reference peak-to-peak voltage signal and the second peak-to-peak voltage signal varies depending on a type of the DUT, a type of the housing, or a mounting position of the DUT inside the housing. The type of the housing may vary according to a material or a shape of the housing, and the mounting position may refer to the test position.

When the DUT, the housing and the mounting position are determined, the steps S1000, S2000, S3000 and S4000 described above with reference to FIG. 2 are performed to determine the reference peak-to-peak voltage signal and the second peak-to-peak voltage signal.

Figure 21:
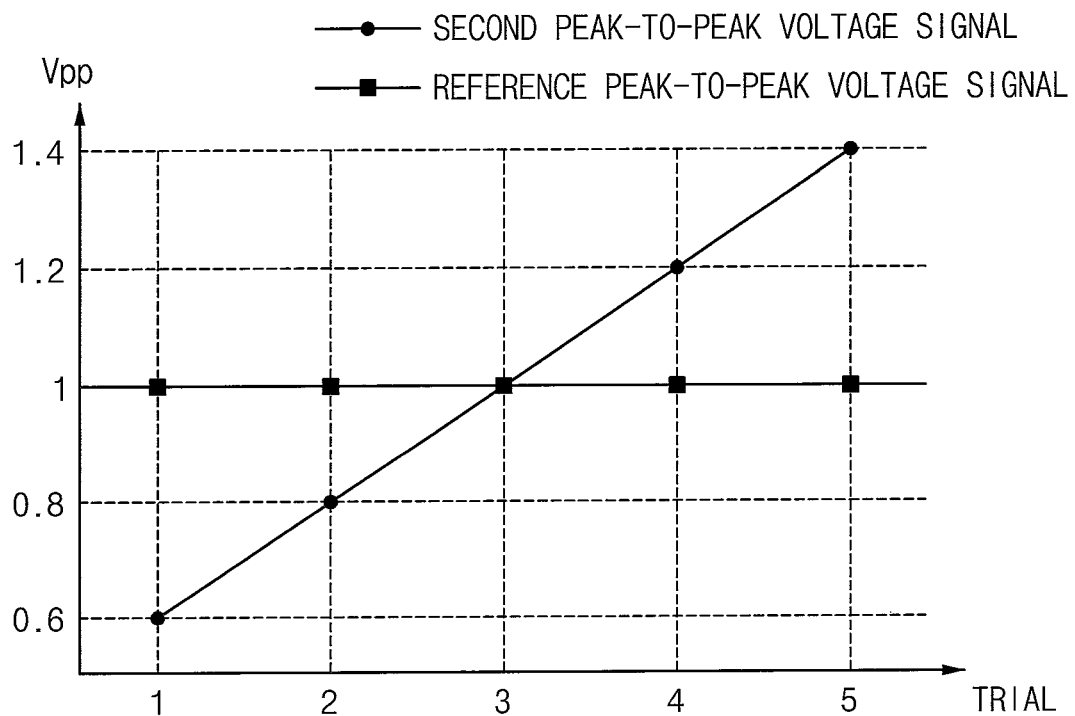
FIG. 21 is a graph illustrating examples of a reference peak-to-peak voltage signal and a second peak-to-peak voltage signal.

FIG. 21 is a graph illustrating examples of a reference peak-to-peak voltage signal and a second peak-to-peak voltage signal.

In FIG. 21, the X-axis represents a plurality of trials TRIAL1, 2, 3, 4 and 5, and the Y-axis represents a value of the peak-to-peak voltage signal. Each of the reference peak-to-peak voltage signal and the second peak-to-peak voltage signal may be normalized by dividing by the value of the reference peak-to-peak voltage signal. The value of the reference peak-to-peak voltage may be expressed as '1', and the value of the second peak-to-peak voltage signal, hereinafter referred to as 'normalized second peak-to-peak voltage signal', may be expressed as a relative ratio value to the value of the reference peak-to-peak voltage signal.

Referring to FIG. 21, at least one of the DUT, the housing and the mounting position may be varied in each of the plurality of trials TRIAL1, 2, 3, 4 and 5. Accordingly, in each of the plurality of trials TRIAL1, 2, 3, 4 and 5, the value of the normalized second peak-to-peak voltage signal may vary.

In some embodiments, the value of the normalized second peak-to-peak voltage signal in a first trial TRIAL1 may be 0.6, and the value of the normalized second peak-to-peak voltage signal in a second trial TRIAL2 may be 0.8. The value of the normalized second peak-to-peak voltage signal in a second trial TRIAL3 may be 1. The value of the normalized second peak-to-peak voltage signal in a second trial TRIAL4 may be 1.2. The value of the normalized second peak-to-peak voltage signal in a second trial TRIAL5 may be 1.4.

Since the value of the normalized second peak-to-peak voltage signal in the first trial TRIAL1 is 0.6, it has a margin of about 67% compared to the reference peak-to-peak voltage signal. On the other hand, in the first trial TRIAL1, it is assumed that the steps S1000, S2000, S3000 and S4000 are performed under a case that a first DUT is mounted at a first mounting position of a first housing to configure an electronic system. In this case, the following conclusion is reached based on the value of the normalized second peak-to-peak voltage signal. That is, when the first DUT is mounted in the first mounting position of the first housing, the first DUT may operate normally without causing a soft failure for an electromagnetic wave having an intensity increase by about 670% compared with a case where the first DUT is exposed in an integrated circuit package state.

Since the value of the normalized second peak-to-peak voltage signal in the second trial TRIAL2 is 0.8, it has a margin of about 25% compared to the reference peak-to-peak voltage signal. On the other hand, in the second trial TRIAL2, it is assumed that the steps S1000, S2000, S3000 and S4000 are performed under a case that a second DUT is mounted at the first mounting position of the first housing to configure an electronic system. In this case, the second DUT may operate normally without causing a soft failure for an electromagnetic wave having an intensity increase by about 25% compared with a case where the second DUT is exposed in a state of an integrated circuit package.

A third trial TRIAL3 to a fifth trial TRIAL5 may also be analyzed in the same manner as the first trial TRIAL1 or the second trial TRIAL2. In the third trial TRIAL3, there is no difference compared to a case where the DUT is exposed in a state of an integrated circuit package. In the fourth trial TRIAL4 and the fifth trial TRIAL5, a soft failure occurs more easily on the DUT compared to a case where the DUT is exposed in a state of an integrated circuit package.

Figure 22A:
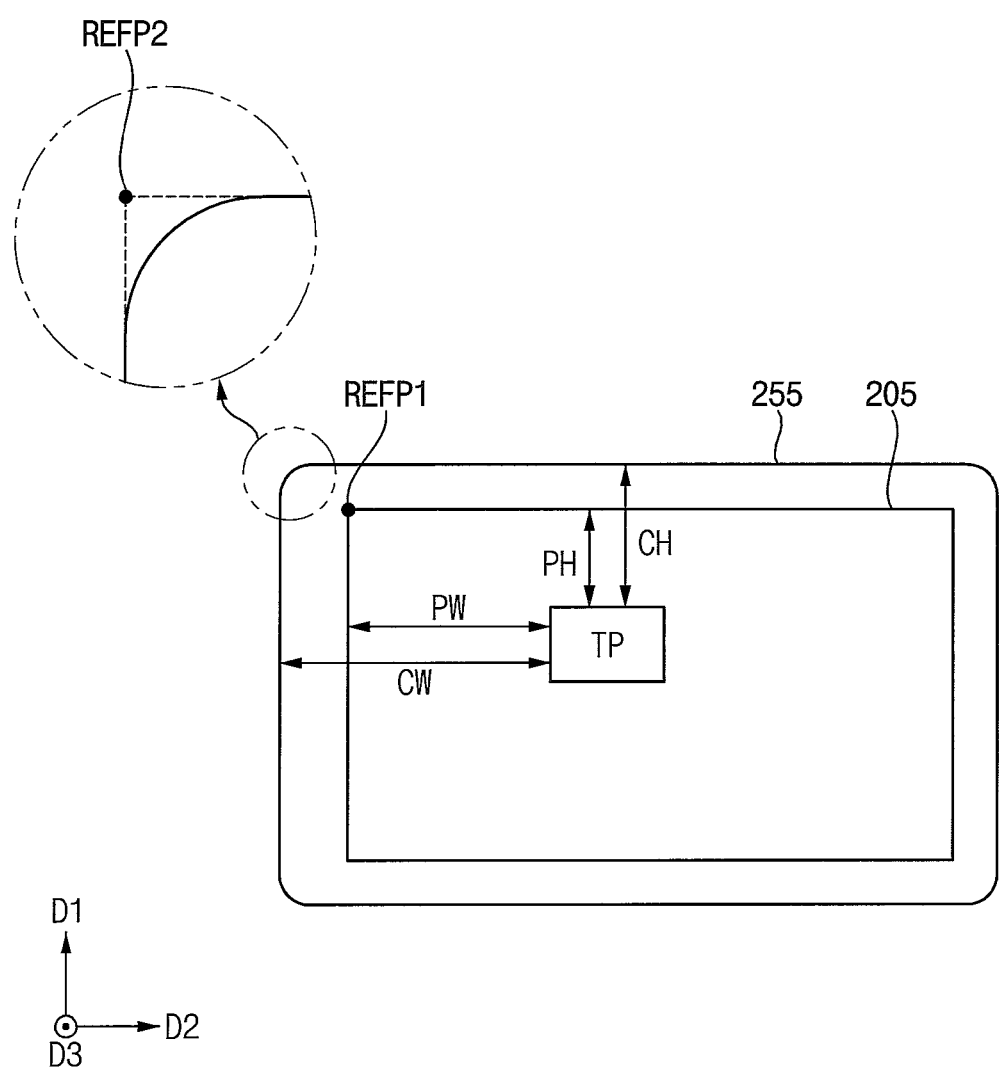
FIG. 22A is a diagram for describing elements constituting a database for a DUT in FIG. 2.
Figures 22B, 23A:
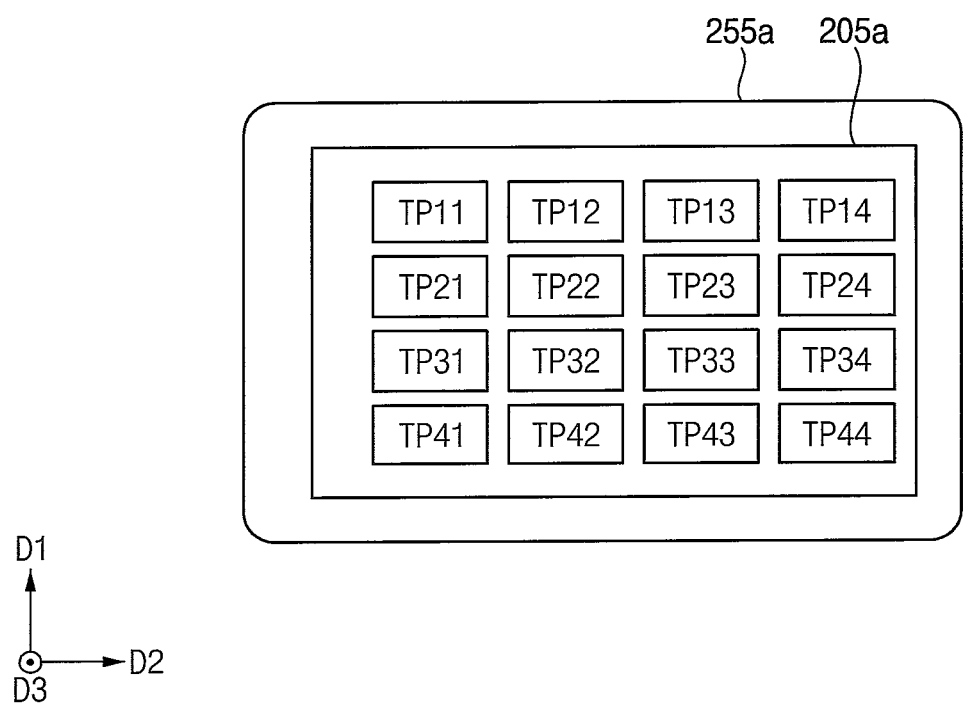
FIG. 22B is a diagram illustrating an example of a database for a DUT in FIG. 2.
FIG. 23A is a diagram for describing elements constituting a database for a DUT in FIG. 2.

FIG. 22A is a diagram for describing elements constituting a database for a DUT in FIG. 2, and FIG. 22B is a diagram illustrating an example of a database for a DUT in FIG. 2.

In FIG. 22A, a circuit board 205 and a housing 255 are illustrated, and a test position TP inside the circuit board 205 and reference positions REFP1 and REFP2 for defining the test position TP are illustrated.

Referring to FIG. 22A, the circuit board 205 and the housing 255 may correspond to elements configuring an electronic system, and the test position TP may be represented by heights PH or CH and widths PW or CW based on one of the first reference position REFP1 or the second reference position REFP2.

In FIG. 22B, in a first electronic system SYSTEM1 including the circuit board 205 and the housing 255, a database generated when the first integrated circuit package IC1 is mounted at a test position TP that is separated by a first height PH1 and a first width PW1 from the first reference position REFP1 is illustrated.

Referring to FIG. 22B, a weak frequency band BW1 and a second peak-to-peak voltage Vpp1 may be recorded with respect to the first integrated circuit package IC1. In this case, an output voltage VREF1 of a static electricity generation device 301 for detecting the frequency spectrum in step S3000 corresponding to the second peak-to-peak voltage Vpp1 or a test voltage VTEST1 provided to the static electricity generation device 301 may be recorded together in the database.

Figures 23B, 24A:
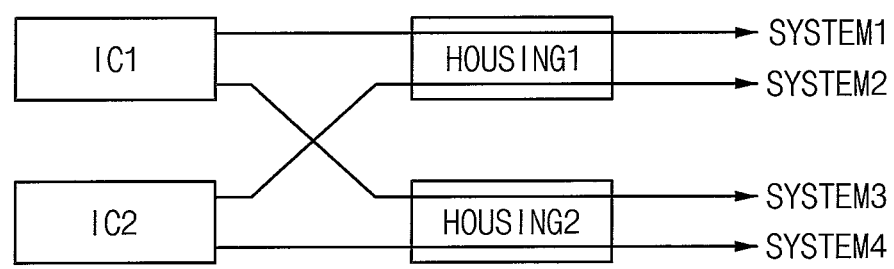
FIG. 23B is a diagram illustrating an example of a database for a DUT in FIG. 2.
FIG. 24A is a diagram for describing elements constituting a database for a DUT in FIG. 2.

FIG. 23A is a diagram for describing elements constituting a database for a DUT in FIG. 2, and FIG. 23B is a diagram illustrating an example of a database for a DUT in FIG. 2.

In FIG. 23A, a circuit board 205a and a housing 255a are illustrated and a plurality of test positions TP11, TP12, TP13, TP14, TP21, TP22, TP23, TP24, TP31, TP32, TP33, TP34, TP41, TP42, TP43 and TP44 inside the circuit board 205a are illustrated. For convenience of description, the reference positions in FIG. 23A are omitted.

Referring to FIG. 23A, the circuit board 205a and the housing 255a may correspond to elements configuring an electronic system, and each of the plurality of test positions may be represented by heights PH or CH and widths PW or CW based on one of the first reference position REFP1 or the second reference position REFP2.

In FIG. 23B, in the first electronic system SYSTEM1 including the circuit board 205a and the housing 255a, a database generated when the first integrated circuit package IC1 is mounted at a first test position TP1, e.g., TP11, that is separated by a first height PH1 and a first width PW1 from the first reference position REFP1, a second test position TP2, e.g., TP24, that is separated by a second height PH2 and a second width PW2 from the first reference position REFP1, and a third test position TP3, e.g., TP42, that is separated by a third height PH3 and a third width PW3 from the first reference position REFP1 is illustrated.

Referring to FIG. 23B, a weak frequency band BW1 and second peak-to-peak voltages Vpp1, Vpp2 and Vpp3 may be recorded with respect to the first integrated circuit package IC1. In this case, an output voltage VREF1 of a static electricity generation device 301 for detecting the frequency spectrum in step S3000 corresponding to the second peak-to-peak voltages Vpp1, Vpp2 and Vpp3 or a test voltage VTEST1 provided to the static electricity generation device 301 may be recorded together in the database.

FIG. 24A is a diagram for describing elements constituting a database for a DUT in FIG. 2, and FIG. 24B is a diagram illustrating an example of a database for a DUT in FIG. 2.

In FIG. 24A, a first integrated circuit package IC1 and a second integrated circuit package IC2 are illustrated, and a first housing HOUSING1 and a second housing HOUSING2 are illustrated. In some embodiments, one of the first integrated circuit package IC1 and the second integrated circuit package IC2 is mounted on one of the first housing HOUSING1 and the second housing HOUSING2 to configure one of the plurality of electronic systems SYSTEM 1, 2, 3 and 4. For convenience of description, the circuit board 205 in FIGS. 22A and 22B is omitted.

Referring to FIG. 24B, when the first integrated circuit package IC1 configures the first electronic system SYSTEM1, the weak band BW1 and the second peak-to-peak voltages Vpp1, Vpp2 and Vpp3 may be recorded. When the first integrated circuit package IC1 configures the second electronic system SYSTEM2, the weak frequency band BW1 and the second peak-to-peak voltages Vpp4, Vpp5 and Vpp6 may be recorded.

Since the DUT is the same as the first integrated circuit package IC1 in the first electronic system SYSTEM1 and the second electronic system SYSTEM2, the weak frequency band does not vary. However, when the electronic system is varied from the first electronic system SYSTEM1 to the second electronic system SYSTEM2, values of the second peak-to-peak voltages may vary.

When the second integrated circuit package IC2 configures the third electronic system SYSTEM3, the weak frequency band BW2 and the second peak-to-peak voltages Vpp7, Vpp8 and Vpp9 may be recorded. When the second integrated circuit package IC2 configures the fourth electronic system SYSTEM4, the weak frequency band BW2 and the second peak-to-peak voltages Vpp10, Vpp11 and Vpp12 may be recorded.

Since the DUT is the same as the second integrated circuit package IC2 in the third electronic system SYSTEM3 and the fourth electronic system SYSTEM4, the weak frequency band does not vary. However, when the electronic system is varied from the third electronic system SYSTEM3 to the fourth electronic system SYSTEM4, values of the second peak-to-peak voltages may vary.

As described above, in a method of performing electrostatic discharge test and an electrostatic discharge test of the present disclosure, after completing a package level process, a plurality of tests are performed on a DUT including an integrated circuit package before shipping the integrated circuit package as a finished product. Further, based on the results of performing the plurality of tests, an ESD characteristic associated with an electronic system including the DUT may be predicted in advance.

Embodiments of the present disclosure may be implemented in a form of a system, a method or a product including a computer-readable program code stored in a computer-readable medium. The computer-readable program code may be provided by processors of various computers or other data processing devices. The computer-readable medium may be a computer-readable signal medium or a computer-readable recording medium. The computer-readable recording medium may be any tangible medium that can store or contain a program in or connected to an instruction execution system, equipment, or device.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an integrated circuit involving performing an electrostatic discharge (ESD) test, the method comprising:
   detecting a weak frequency band by sequentially radiating a plurality of first electromagnetic waves on a first test board including the integrated circuit;
   detecting first peak-to-peak voltage signals by sequentially radiating the plurality of first electromagnetic waves on a second test board including an electromagnetic wave receiving module;
   detecting a frequency spectrum by radiating a second electromagnetic wave on a housing including a third test board including the electromagnetic wave receiving module;
   generating a second peak-to-peak voltage signal based on the weak frequency band, the first peak-to-peak voltage signals and the frequency spectrum; and
   predicting an ESD characteristic associated with an electronic system including the integrated circuit based on the second peak-to-peak voltage signal.

2. The method of claim 1, wherein detecting the weak frequency band includes:
   adjusting a filtering frequency band of a filter circuit;
   performing a first detection preparation operation in which the plurality of first electromagnetic waves are radiated on the first test board by increasing an output voltage of a static electricity generation device from a first voltage to a second voltage; and
   performing a second detection preparation operation in which it is determined whether a soft failure occurs on the integrated circuit.

3. The method of claim 2, wherein the filtering frequency band includes first to X-th frequency bands, where X is a natural number greater than or equal to three, and
   wherein detecting the weak frequency band further includes:
      setting the filtering frequency band to the first frequency band;
      sequentially performing the first detection preparation operation and the second detection preparation operation based on the first frequency band;
      setting the filtering frequency band to the second frequency band;
      sequentially performing the first detection preparation operation and the second detection preparation operation based on the second frequency band;
      setting the filtering frequency band to the X-th frequency band; and
      sequentially performing the first detection preparation operation and the second detection preparation operation based on the X-th frequency band.

4. The method of claim 3, wherein:
   it is determined that the soft failure does not occur on the integrated circuit when the second detection preparation operation is performed based on the first frequency band and the X-th frequency band, and
   it is determined that the soft failure does occur on the integrated circuit when the second detection preparation operation is performed based on the second frequency band.

5. The method of claim 3, wherein the second frequency band has a center frequency higher than a center frequency of the first frequency band, and the X-th frequency band has a center frequency higher than the center frequency of the second frequency band, and
   wherein detecting the weak frequency band further includes:
      detecting the weak frequency band that is a frequency band between the center frequency of the first frequency band and the center frequency of the X-th frequency band.

6. The method of claim 1, wherein detecting the first peak-to-peak voltage signals includes:
   removing the integrated circuit from the first test board; and
   preparing the second test board by mounting the electromagnetic wave receiving module on a position corresponding to the position where the integrated circuit is removed on the first test board.

7. The method of claim 1, wherein the electromagnetic wave receiving module includes:
   a conductive pattern formed on an upper surface of the second test board, and configured to receive the plurality of first electromagnetic waves; and
   a transmission line configured to transmit the plurality of first electromagnetic waves; and
   a shielding member configured to shield the plurality of first electromagnetic waves.

8. The method of claim 2, wherein detecting the first peak-to-peak voltage signals includes:
   adjusting the filtering frequency band of the filter circuit;
   performing a third detection preparation operation in which the plurality of first electromagnetic waves are radiated on the second test board by setting the output voltage of the static electricity generation device to be higher than a reference output voltage; and
   performing a fourth detection preparation operation in which first result signals generated by sequentially radiating the plurality of first electromagnetic waves on the second test board are received.

9. The method of claim 8, wherein the filtering frequency band includes first to X-th frequency bands, where X is a natural number greater than or equal to three, and
   wherein detecting the first peak-to-peak voltage signals further includes:
      setting the filtering frequency band to the first frequency band;
      sequentially performing the third detection preparation operation and the fourth detection preparation operation based on the first frequency band;

setting the filtering frequency band to the second frequency band;
sequentially performing the third detection preparation operation and the fourth detection preparation operation based on the second frequency band;
setting the filtering frequency band to the X-th frequency band; and
sequentially performing the third detection preparation operation and the fourth detection preparation operation based on to the X-th frequency band.

10. The method of claim 8, wherein detecting the first peak-to-peak voltage signals further includes:
generating the first peak-to-peak voltage signals based on the first result signals.

11. The method of claim 8, wherein the reference output voltage is determined based on first output voltages of the static electricity generation device obtained when it is determined, based on the second detection preparation operation, that the soft failure occurs on the integrated circuit.

12. The method of claim 8, wherein detecting the frequency spectrum includes:
mounting the electromagnetic wave receiving module on a test position of the third test board;
disposing the third test board inside the housing;
performing a fifth detection preparation operation in which the second electromagnetic wave is radiated on the housing by setting the output voltage of the static electricity generation device to be higher than the reference output voltage;
performing a sixth detection preparation operation in which a second result signal generated by radiating the second electromagnetic wave on the housing is received; and
detecting the frequency spectrum based on the second result signal.

13. The method of claim 12, wherein the test position is determined based on a design of the electronic system including the integrated circuit.

14. The method of claim 12, wherein generating compensation factors comprises:
removing first voltage signals corresponding to a frequency band out of the weak frequency band from among the first peak-to-peak voltage signals; and
generating the compensation factors by performing a compensation operation on second voltage signals corresponding to the weak frequency band other than the first voltage signals from among the first peak-to-peak voltage signals.

15. The method of claim 1, wherein generating the second peak-to-peak voltage signal includes:
generating compensation factors based on the weak frequency band and the first peak-to-peak voltage signals;
generating compensated amplitude values by compensating amplitude values on the frequency spectrum based on the compensation factors; and
converting the compensated amplitude values into the second peak-to-peak voltage signal.

16. The method of claim 1, wherein predicting the ESD characteristic includes:
receiving a reference peak-to-peak voltage signal corresponding to the integrated circuit; and
predicting the ESD characteristic associated with the electronic system including the integrated circuit by comparing the reference peak-to-peak voltage signal with the second peak-to-peak voltage signal.

17. The method of claim 1, wherein the plurality of first electromagnetic waves are generated by a noise signal generator and radiated on the first test board or the second test board through a near-field probe, and
wherein the noise signal generator includes:
a static electricity generation device configured to generate a source electromagnetic wave;
a receiving antenna configured to receive the source electromagnetic wave; and
a filter circuit configured to filter a frequency band of the source electromagnetic wave to generate the plurality of first electromagnetic waves and the second electromagnetic wave.

18. An electrostatic discharge (ESD) test system comprising:
a first tester configured to sequentially radiate a plurality of first electromagnetic waves on a first test board including a device under test (DUT), and configured to sequentially radiate the plurality of first electromagnetic waves on a second test board including an electromagnetic wave receiving module;
a second tester configured to radiate a second electromagnetic wave on a housing including a third test board including the electromagnetic wave receiving module; and
an automatic test equipment configured to
detect a weak frequency band associated with the DUT based on sequentially radiating the plurality of first electromagnetic waves on the first test board,
detect a first peak-to-peak voltage signal associated with the DUT based on sequentially radiating the plurality of first electromagnetic waves on the second test board,
detect a frequency spectrum based on radiating the second electromagnetic wave on the housing,
generate a second peak-to-peak voltage signal based on the weak frequency band, the first peak-to-peak voltage signals and the frequency spectrum, and
predict an ESD characteristic associated with an electronic system including the DUT based on the second peak-to-peak voltage signal.

19. The ESD test system of claim 18, wherein the plurality of first electromagnetic waves are generated by a noise signal generator and radiated to the first test board or the second test board through a near-field probe, and
wherein the noise signal generator includes:
a static electricity generation device configured to generate a source electromagnetic wave;
a receiving antenna configured to receive the source electromagnetic wave; and
a filter circuit configured to filter a frequency band of the source electromagnetic wave to generate the plurality of first electromagnetic waves and the second electromagnetic wave.

20. A method of performing an electrostatic discharge (ESD) test, the method comprising:
detecting a weak frequency band by sequentially radiating a plurality of first electromagnetic waves on a first test board including a device under test (DUT);
detecting first peak-to-peak voltage signals by sequentially radiating the plurality of first electromagnetic waves on a second test board including an electromagnetic wave receiving module;
detecting a frequency spectrum by radiating a second electromagnetic wave on a housing including a third test board including the electromagnetic wave receiving module;

generating a second peak-to-peak voltage signal based on the weak frequency band, the first peak-to-peak voltage signals and the frequency spectrum;
predicting an ESD characteristic associated with an electronic system including the DUT based on the second peak-to-peak voltage signal; and
generating a database with respect to the DUT,
wherein the DUT is mounted at a first position on the first test board, the electromagnetic wave receiving module is mounted at a second position on the second test board, and the electromagnetic wave receiving module is mounted at a test position on the third test board, and
wherein the test position is determined based on a design of the electronic system including the DUT.

* * * * *